US006593077B2

(12) United States Patent
Faur et al.

(10) Patent No.: US 6,593,077 B2
(45) Date of Patent: **\*Jul. 15, 2003**

(54) METHOD OF MAKING THIN FILMS DIELECTRICS USING A PROCESS FOR ROOM TEMPERATURE WET CHEMICAL GROWTH OF SIO BASED OXIDES ON A SUBSTRATE

(75) Inventors: Maria Faur, North Olmsted, OH (US); Horia M. Faur, North Olmsted, OH (US); Mircea Faur, North Olmsted, OH (US)

(73) Assignee: Special Materials Research and Technology, Inc., North Olmsted, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/891,832

(22) Filed: Jun. 26, 2001

(65) Prior Publication Data

US 2003/0027433 A1 Feb. 6, 2003

Related U.S. Application Data

(63) Continuation-in-part of application No. 09/602,489, filed on Jun. 23, 2000, and a continuation-in-part of application No. 09/273,373, filed on Mar. 22, 1999, now Pat. No. 6,080,683.

(51) Int. Cl.$^7$ .................. H01L 21/31; H01L 21/469
(52) U.S. Cl. .................. 430/770; 438/769; 438/787; 427/443.2; 427/435
(58) Field of Search ................ 438/770, 769, 438/787, 789, 790; 427/443.2, 435

(56) References Cited

U.S. PATENT DOCUMENTS 2,505,629 A    4/1950  Thomsen et al.
4,332,973 A    6/1982  Sater
4,347,097 A    8/1982  Nishizawa (List continued on next page.)

FOREIGN PATENT DOCUMENTS

WO    WO 00/57464    9/2000

OTHER PUBLICATIONS

"The Physicochemical Properties and Growth Mechanism of Oxide ($SiO_{2-x}F_x$) by Liquid Phase Deposition with $H_2O$ Addition Only", Ching–Fa Yeh, Chun–Lin Chen, and Guan–Hong Lin, J. Electrochem. Soc., vol. 141, No. 11, Nov. 1994, pp. 3177–3181.

"Low–Temperature Processed MOSFET's with Liquid Phase Deposited $SiO_{2-x}F_x$ as Gate Insulator", Ching–Fa Yeh, Shyue–Shyh Lin, and Tzy–Yan Hong, IEEE Electron Device Letters, vol. 16, No. 7, Jul. 1995, pp. 316–318.

"Photoassisted Liquid–Phase Deposition of Silicon Dioxide", Chen–Tang Huang, Peng–Heng Chang, and JinShown Shie, J. Electrochem. Soc., vol. 143, No. 6, Jun. 1996, pp. 2044–2048.

"A New Process for Silica Coating", Hirotsugu Nagayama, Hisao Honda, and Hideo Kawahara, J. Electrochem. Soc.: Solid–State Science and Technology, Aug. 1988, pp. 2013–2016.

(List continued on next page.)

*Primary Examiner*—Alexander Ghyka
(74) *Attorney, Agent, or Firm*—Pearne & Gordon LLP

(57) ABSTRACT

Disclosed is a room temperature wet chemical growth (RTWCG) process of SiO-based insulator coatings on silicon substrates for electronic and photonic (optoelectronic) device applications. The process utilizes a mixture of a silicon source, a pyridinium compound, an aqueous redox solution, and a homogeneous aqueous solution.

56 Claims, 10 Drawing Sheets

U.S. PATENT DOCUMENTS

| | | | |
|---|---|---|---|
| 4,409,422 A | 10/1983 | Sater | |
| 4,431,683 A | 2/1984 | Sasaki et al. | |
| 4,462,846 A | 7/1984 | Varshney | |
| 4,468,420 A | 8/1984 | Kawahara et al. | |
| 4,516,314 A | 5/1985 | Sater | |
| 4,693,916 A | 9/1987 | Nagayama et al. | |
| 5,073,408 A | 12/1991 | Goda et al. | |
| 5,132,140 A | 7/1992 | Goda et al. | |
| 5,429,995 A | 7/1995 | Nishiyama et al. | |
| 5,492,736 A * | 2/1996 | Laxman et al. | 427/579 |
| 5,492,859 A | 2/1996 | Sakaguchi et al. | |
| 5,506,006 A | 4/1996 | Chou et al. | |
| 5,536,361 A | 7/1996 | Kondo et al. | |
| 5,616,233 A | 4/1997 | Jenn-Gwo et al. | |
| 5,646,440 A | 7/1997 | Hasegawa | |
| 5,648,128 A | 7/1997 | Yah et al. | |
| 5,659,192 A | 8/1997 | Sarama et al. | |
| 5,661,092 A | 8/1997 | Koberstein et al. | |
| 5,674,356 A | 10/1997 | Nagayama | |
| 5,703,404 A | 12/1997 | Matsuura | |
| 6,022,814 A * | 2/2000 | Mikoshiba et al. | 438/789 |
| 6,080,683 A * | 6/2000 | Faur et al. | 438/770 |

OTHER PUBLICATIONS

"A Selective $SiO_2$ Film–Formation Technology Using Liquid–Phase Deposition for Fully Planarized Multilevel Interconnections", Tetsuya Homma, Takuya Katoh, Yoshiaki Yamada, and Yukinobu Murao, J. Electrochecm. Soc., vol. 140, No. 8, Aug. 1993, pp. 2410–2414.

"The Initial Growth Mechanism of Silicon Oxide by Liquid–Phase Deposition", Jenq–Shiuh Chou and Si–Chen Lee, J. Electrochem. Soc., vol. 141, No. 11, Nov. 1994, pp. 3214–3218.

Semiconductor International, "Researchers Build Optics into Silicon", Jan. 1997.

FEOL cleaning process/RCA procedure, "Cleaning of the Silicone Wafer", at least as early as Jun. 26, 2001, 12 pages.

Semiconductor International, "New Clean Challenges RCA Clean's Domination", Sep. 1995, pp. 18 and 21.

Appl. Phys. Lett. 71 (19), "$SiO_2$ film thickness metrology by x–ray photoelectron spectroscopy", Nov. 10, 1997, pp. 2764–2766.

Surface Interface Analysis, vol. 25, "Elastic Scattering Corrections in AES and XPS, II. Estimating Attenuation Lengths and Conditions Required for their Valid Use in Overlayer/Substrate Experiments", 1997, pp. 430–446.

Semiconductor Industry International 1999 SIA Roadmap, The International Technology Roadmap for Semiconductors: 1999, page printout from web site plus,pp. 123–128.

* cited by examiner

METHOD OF MAKING THIN FILMS DIELECTRICS USING A PROCESS FOR ROOM TEMPERATURE WET CHEMICAL GROWTH OF SIO BASED OXIDES ON A SUBSTRATE

REFERENCE TO RELATED APPLICATIONS

This application is a continuation-in-part application of U.S. application Ser. No. 09/602,489 entitled "Room Temperature Wet Chemical Growth Process of SiO Based Oxides on Silicon" which was filed on Jun. 23, 2000 as a continuation-in-part application of U.S. application Ser. No. 09/273,373 entitled "Room Temperature Wet Chemical Growth Process of SiO Based Oxides on Silicon" which was filed on Mar. 22, 1999, now U.S. Pat. No. 6,080,683 issued Jun. 27, 2000.

BACKGROUND OF THE INVENTION

This invention relates to a room temperature wet chemical growth (RTWCG) process of SiO-based thin film dielectrics on substrates including Si, Ge, III-V and I-III-VI compound semiconductors and, specifically, to the RTWCG of SiO-based films on silicon, and other substrates in the manufacture of silicon-based electronic and photonic (optoelectronic and/or microelectronic) device applications. One particular application involves the use of this room temperature wet chemical growth process to make optical components.

Silicon dioxide ($SiO_2$) forms the basis of the planar technology. In industrial practice, insulator coatings for electronic and photonic device layers are most frequently formed by thermal oxidation of Silicon (Si) in the temperature range 900° C. to 1200° C. $SiO_2$ is also deposited by chemical vapor deposition (CVD) techniques at lower temperatures (200° C. to 900° C.) on various substrates.

Thermal and CVD-grown $SiO_2$ based layers are used as diffusion masks, to passivate device junctions, as electric insulation, as dielectric material in Si technology, and as capping layers for implantation-activation annealing in III-V compound semiconductor technology, to name a few.

The growth of insulator films at low temperatures is very attractive for most device applications due to reduced capital cost, and high output and technological constraints associated with the growth of dielectric thin films using conventional high-temperature growth/deposition techniques.

Dielectric films for photonic devices are well known in the art and are usually deposited at near room temperature on various substrates using physical vapor deposition processes including conventional (nonreactive) or reactive resistive, induction or electron beam evaporation, reactive or nonreactive dc or RF magnetron and ion-beam sputtering processes.

Room temperature growth of insulator layers on semiconductor surfaces using anodic oxidation is known in the art. Using anodic oxidation, up to 200 nm $SiO_2$ layers can be grown on underlying Si substrates. The anodic oxidation process consumes about 0.43 of the thickness of the oxide from the underlying Si substrate, and is not compatible with most metallization schemes. This limits its application as a replacement of thermal or vacuum deposited $SiO_2$.

Deposition of $SiO_2$ insulator layers from solutions is known in the art using organo-metallic solutions. In this procedure, the insulator layer is applied onto the substrate either by dipping the substrate into the solution or by spinning the substrate after a small amount of the solution is applied onto the surface. In both cases the substrate is then placed in an oven to drive off the solvent.

Researchers from Japan, China and Taiwan describe processes for deposition of $SiO_2$ and $SiO_{2-x}F_x$ layers on glass and silicon surfaces using a slightly above room temperature (30 to 50 degrees C.) solution growth. The growth of liquid-phase deposited (LPD) $SiO_2$, initially proposed by Thomsen et al. for deposition of $SiO_2$ on the surface of soda lime silicate glass, is based on the chemical reaction of $H_2SiF_6$ with water to form hydrofluoric acid and solid $SiO_2$. The initial $H_2SiF_6$ solution is saturated with $SiO_2$ powder (usually in a sol-gel form). Before immersing the glass into the solution, a reagent that reacts with the hydrofluorosilicilic acid, such as boric acid, was added to the solution. Boric acid reacts with the hydrofluorosilicilic acid and makes the solution supersaturated with silica.

One of the major disadvantages of the $SiO_2$ LPD method described above, is the very low deposition rate of about 8 nm/hour to about 24 nm/hour, making it impractical for growing insulator layers for most semiconductor device applications. Deposition rates of up to 110 nm/hour are claimed by Ching-Fa Yeh et al. in the hydrofluorosilicilic acid-water system and the composition of the resulting films was reported to be $SiO_{2-x}F_x$ where x is about 2%. Our own experimentation using the LPD method, seems to indicate that the LPD $SiO_2$ has poor adhesion to the Si surfaces, and the maximum growth rate we obtained is smaller than the reported values (less than 25 nm/hour). Even assuming that the reported 110 nm/hour deposition rates are possible, these deposition rates are still too low since, assuming that the deposition rate is constant with the deposition time, it will require about 9 hours to deposit an oxide with a thickness of about 1 $\mu$m needed for ULSI interlevel dielectric.

The term RTWCG process of SiO-based insulator layers, as used herein, means, a room temperature (e.g., 10°–50° C., or preferably about 15°–30° C.) wet chemical growth process of silicon oxide layers. While this layer is referred to in this application as a "silicon oxide layer", this means a layer comprising of $Si_xO_yX_z$ (SiOX) layers where x is from 0.9 to 1.1, y is from 0.9 to 1.9 and z is from 0.01 to 0.2 [Si stands for silicon, O stands for oxygen, and X is either fluorine (F), carbon (C) or a combination of these with iron (Fe), palladium (Pd), or titanium (Ti) contaminants, depending on the catalyst and the redox system being used]. The room temperature wet chemical growth process of the present invention can be used to deposit thin films with a range of refractive indices. This capability enables the process to be used for the manufacture of optoelectronic devices including for example, fiber-optic cable, and waveguides.

Waveguides are now known and used for multiplexing or demultiplexing multiple channels. These devices typically include nano-scale planar optical pathways that confine an optical beam by internal reflection similarly to an optical fiber, but with a rectangular (or square) cross-section. Suitable substrates include silicon and gallium arsenide. Of particular advantage is the fact that the structure can be integrated at the chip level with various microelectronic, MEMS, optical or optoelectronic devices as desired. The technology also encompasses the production of wafer-scale integration of multiple application specific computer chips. These could use light instead of aluminum or copper interconnects. Optical waveguides could be the last step in fabricating such a device since formation can be accomplished without having to raise the temperature of the wafer to accomplish growth. The waveguide definition can be accomplished using standard photolithographic processing.

SUMMARY OF THE INVENTION

This invention relates to a room temperature wet chemical growth (RTWCG) process of silicon oxide (SiO) based thin film dielectrics on semiconductor substrates and, specifically, to the RTWCG of SiO-based films on silicon as well as other materials in the manufacture of silicon-based electronic and photonic (optoelectronic) device applications.

It is an object of the invention to provide a silicon oxide-based film using a room temperature wet chemical growth (RTWCG) process for electronic and photonic (optoelectronic) device applications that is compatible with device fabrication steps, has large growth rates, low stress, good adhesion to silicon and silicon oxide coated surfaces, is stable on long term air exposure, and high temperature annealing, and that has very good conformity.

It is a further object to provide a silicon oxide-based RTWCG process of low dielectric constant SiO based films for use as intermetallic dielectric (IMD) and interlevel dielectric (ILD) in ultra large scale integrated (ULSI) silicon based microelectronics.

It is a further object to provide an ultra thin film silicon oxide-based RTWCG process to be used as gate dielectric for ULSI silicon based microelectronics.

It is a further object to provide a silicon oxide-based RTWCG process of thin film insulators to be used as passivation layers for photonic (optoelectronic) device applications.

It is a further object to provide a silicon oxide-based RTWCG process to grow passivating/antireflection coatings, after the front grid metallization for the fabrication of low cost silicon solar cells and for other photonic (optoelectronic) device applications.

It is a further object to provide a silicon oxide-based RTWCG deposition process to be used as passivating films for porous silicon coated photonic (optoelectronic) devices.

It is a further object of this invention to utilize the room temperature wet chemical growth process for the manufacture of optoelectric devices including fiber optic cable and waveguides.

High growth rates of SiOX oxides according to this invention are grown on planar or porous silicon using, for example, commercial grade $H_2SiF_6$ (34% by weight in an aqueous solution) as silicon source, N-n-butylpyridinium chloride ($C_9H_{14}ClN$) and "redox" or oxidation/reduction aqueous solution based on $Fe^{2+}/Fe^{3+}$, e.g. $K_3Fe(CN)_6$ and/or iron ethylenediaminetetraacetic acid (Fe EDTA). For convenience, the above class of solutions we will call the basic growth solution. The basic solution (BS) can be saturated with $SiO_2$-containing sources such as silica gel. Catalysts such as palladium II trifluoroacetate [$Pd(O_2C_2F_3)_2$] (PdFAc) and $H_2TiF_6$ aqueous solutions are used to increase the growth rate. NaOH, KOH, NaF and $NH_4F$ and HF solutions are used according to this invention to adjust the pH of the growth solution. The RTWCG rate on Si surfaces is from 2 nm/minute to 70 nm/minute, depending on the composition of the solution, pH, and crystallographic orientation of the Si substrates. The chemical composition of the grown layer has the general formula: $Si_xO_yX_z$, where the significance of Si, O, X, and x, y and z are as explained above.

BRIEF DESCRIPTION OF THE DRAWINGS

The foregoing and other objects, features and advantages of the invention will be apparent from the following more particular description of preferred embodiments of the invention, as illustrated in the accompanying drawings.

DETAILED DESCRIPTION OF THE PREFERRED EMBODIMENTS

Figure 1:
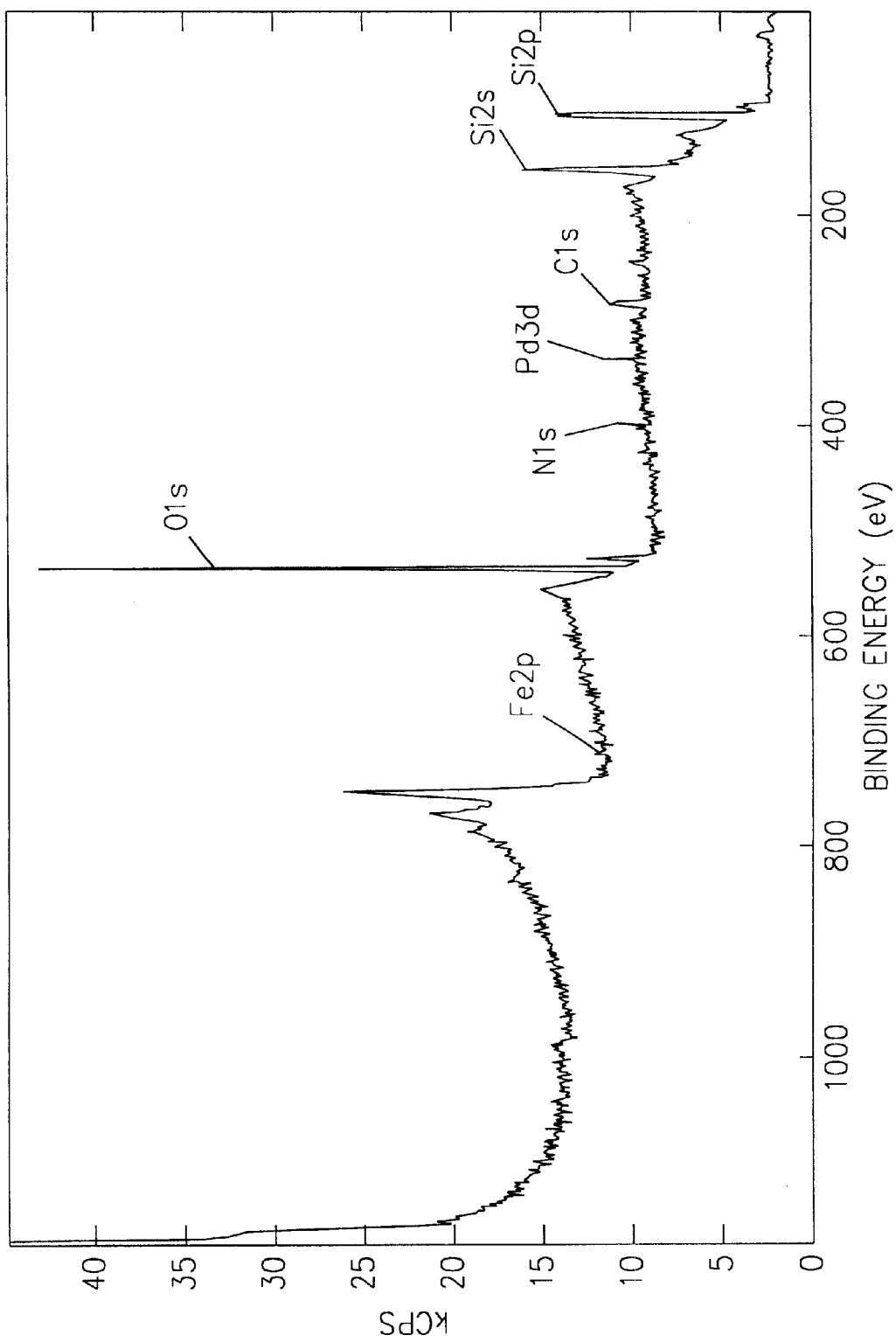
FIG. 1 is a XPS surface survey of an RTWCG SiOX oxide (89 nm thick), grown on (111) p-type Si:B in A4:Pd solution, after sputtering of about 30 nm from the surface.

Surface OH groups are known in the art as one of the most important sites for chemical reactions at oxide surfaces. The OH groups are formed by the chemisorption of water molecules on the oxide surface. The hydration mechanism involves the dissociation of an adsorbed water molecule, where an $H^+$ ion bonds to an oxygen ion on the surface and an $OH^-$ ion bonds to a silicon ion on the surface. The SiOH groups can undergo acid or base reactions. They accept a hydrogen ion to become an $SiOH_2^+$ site having a positive charge, or they release a hydrogen ion to become $SiO^-$ site having a negative charge. The reactions are written as:

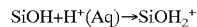

$$SiOH + H^+(Aq) \rightarrow SiOH_2^+$$

$$SiOH \rightarrow SiO^- + H^+(Aq)$$

The concentration of the $SiOH_2^+$ and $SiO^-$ species depend on the pH of the aqueous phase. The $SiOH_2^+$ species increases at pH<7, while the $SiO^-$ species increases at pH>7.

In accordance with the invention, the substrate is cleaned prior to the formation of the oxide layer. Preferably this cleaning is performed using a technique known in the industry as a "RCA" clean. After the RCA clean, and prior to the final water rinse, the silicon surface is passivated by Si—H and Si—F bonds. We define the "induction time" as the time interval $dt = t_{ox} - t_{in}$, where $t_{ox}$ is the time referenced to the initial time ($t_{in}$) after which the oxide deposition is initiated. For HF treated surfaces we found an induction time from 10 seconds to 2 minutes. On the contrary, on similar silicon samples covered either with a thin native oxide (no RCA clean) or thermally grown $SiO_2$ layers, the induction time is from about 10 to 20 seconds.

Prior to the initiation of the RTWCG of SiOX-based layer, for hydrogen- or fluorine-terminated Si surfaces the Si—H and Si—F bond has to be converted into the Si—OH bonding group.

The hydration mechanism of hydrogen passivated surfaces should follow the reaction:

Si—H+OH⁻→Si—O⁻+H₂.

For Si—F terminated bonds, rinsing the samples in water allows the Si—F Si—OH to take place according to the reaction:

Si—F+H₂O→Si—OH+HF

From the last two reactions, it is apparent that in the presence of HF, the surface may be subjected to HF attack through HF insertion into the Si—O bond, according to the reaction:

Si—O⁻+HF→Si—F+OH⁻ with the subsequent removal of the surface Si atom from the surface of the underlying Si—O oxide.

We found that after the HF dip, rinsing the substrates in deionized water for 5 to 10 minutes or 0.1% H₂O₂ for 1 to 2 minutes, depending on the crystallographic orientation, doping type and majority carrier concentration, the induction time for all silicon substrates was below 20 seconds.

Once the growth of a native oxide layer has begun, Si—H and Si—F bonds are replaced by the Si—OH bonds. These Si—OH groups in turn facilitate the incorporation from the growth solution of silicon and oxygen by forming Si—O—Si bonds. Associated Si—OH groups also act as preferential adsorption sites for water molecules, further speeding up the oxygen and silicon incorporation process.

In designing the room temperature RTWCG process of SiOX dielectric layers, we sought the following conditions:

1. The use of elements, which are known to harm the semiconductor devices, should be avoided; only Si (O, C, H, and N) are acceptable.
2. For growing SiOX oxides, metal impurities such as Mg, Ti, and Ta should be avoided because they are known to introduce large density of states at the Si/insulator interface.
3. The SiOX films should be stable in reducing and oxidizing atmosphere, with respect to factors such as heat, humidity, prolonged exposure to UV light, atomic oxygen and ionizing radiation such as high energy electrons and protons.
4. The growth process should be applicable to any Si surface, irrespective of crystal orientation, size and shape.
5. The growth process should be compatible with processing sequences of advanced Si devices, e.g. VLSI microelectronics with critical features below 0.25 $\mu$m.

High-deposition-rate SiOX oxides, are deposited using commercial grade H₂SiF₆ (34%) as a silicon source, n,n-butyldipyrinium chloride (n-BPCl), and a redox Fe²⁺/Fe³⁺ system, such as K₃Fe(CN)₆$_{(aq)}$ (from here on written as KFeCN) and Fe EDTA$_{(aq)}$. Unless otherwise specified, the % given represents a percentage by weight in an aqueous solution (if applicable).

In a preferred embodiment of the invention, the growth solution is made by mixing 2 to 5 volume parts of 34% H₂SiF₆ (from here on written as HSiF) with 1 to 5 volume parts of 0.5 M KFeCN$_{(aq)}$ and 0 to 4 volume parts of 5% n-BPCl$_{(aq)}$. This solution, for convenience we will call: "the basic solution (BS)." The BS can be saturated with SiO₂-ritch sources such as silica gel or with silicon containing compounds such as (NH₄)₂SiF₆. A number of sources for silicon include for example, fluorosilicates, chlorosilicates, and bromosilicates, and specifically includes the following: hydrofluorosilic acid, silicon tetrachloride, silicon tetrafluoride, silicon tetrabromide, dichlorosilane, and silica gel. Specific inorganic silicon sources include K₂SiF₆, Mg₂Si3O₈, MoSi₂, Na₂SiO₃, SiS₂, ZrSi₂, Mg₂Si, H₂SiF₆, NH₄SiF₆, SiO₂, SiO, and Si. Organic silicon sources can also be used and include for example, (CH₃)₃SiOK, (CH₃)₄NOH: 10SiO₂, (CH₃)₃CSi(CH₃)₂Cl, [(CH₃)SiO]₄, CaSiO₃, CaSiO₂, and [(CH₃)Si]. Catalysts such as palladium II trifluoroacetate Pd(O₂C₂F₃)₂ (from here on written as PdFAc), and Ti⁴⁺-based aqueous solutions such as hexafluorotitanate H₂TiF₆ (from here on written as HTiF), titanium chloride TiCl₄ (from here on written as TiCl) and (NH₄)₂TiF₆ (from here on written as NHTiF) were found to be acceptable catalysts for the growth of SiOX layers. HF, KOH, NaF, NH₄OH and NH₄F aqueous solutions are used according to this invention to adjust the pH of the growth solution.

The volume of the growth solution is from 0.2 ml to 0.6 ml/1 cm² of the Si surface, which comes in contact with the solution, not including the portions of the surface covered by photoresist, for a SiOX oxide thickness of 0.1 to 0.25 $\mu$m. For best results, the RTWCG solution may be agitated by any practical means, so that the solids completely dissolve and to ensure uniform coating during the RTWCG process.

In FIG. 1 is given a XPS surface survey of an RTWCG SiOX oxide, grown on (111) p-type Si:B with ($N_A$-$N_D$) of about 2×10¹⁹ cm⁻³ using the A4:Pd solution, after sputtering about 30 nm from the surface. The composition of the A4:Pd RTWCG solution is: 5 volume parts of 34% HSiF, 3 volume parts of 5% n-BPCl, 2 volume parts of 30% HNO₃ solution, 1 volume part CH₃COOH, 0.1 gram of KFeCN and 10 mg of PdFAc.

Prior to the growth, the solution was stirred using a magnetic stirrer for 10 minutes. The surface of the Si substrate was cleaned using the standard RCA clean, and rinsed in deionized (DI) water for 10 minutes. After a 3-minute growth in the absence of light, the thickness of the oxide measured by ellipsometry was 89 nm. This corresponds to a growth rate of about 30 nm/min. However, for longer growth times, the growth rate decreases, reaching about 12 nm/min after 10 minutes growth time. The thickness of the underlying substrate removed during the growth was about 20 nm for the 89 nm thick oxide and about 32 nm for the 123 nm thick oxide. In both cases, this is about 25% of the oxide thickness. This indicates that the oxide formation process is not a simple chemical oxidation, otherwise, the thickness of the removed layer from the Si surface, should have been at least 43% the thickness of the oxide. The oxide formation in this case is a dual chemical oxidation and growth process.

The RTWCG rates in A4:Pd solutions we found to be highly preferential for silicon wafers with various crystallographic orientation. For example, the growth rate is up to 15 fold higher for (111) Si compared to (100) Si, and up to 4 fold for (110) Si compared to (100) Si. The chemical composition of the above oxides is Si-rich SiOX, as revealed by XPS data. In Table 1 are shown some quantitative XPS data, including the position, normalized areas and the atomic concentration of the main components of the oxide, recorded after sputtering about 30 nm from the surface of the 89 nm thick oxide.

TABLE 1

Quantification Table for Experiment A4:Pd-12. Sputtered 30 nm.

| Peak | Center (eV) | SF | Norm. Area | [AT]% |
|---|---|---|---|---|
| F 1s | 686.5 | 1.00 | 4.67676 | 0.401 |
| O 1s | 532.0 | 0.66 | 507.31055 | 43.463 |
| Pd 3d | 342.5 | 4.60 | 0.61422 | 0.053 |
| C 1s | 283.5 | 0.25 | 67.43414 | 5.777 |
| Si 2p | 99.5 | 0.27 | 587.19482 | 50.307 |

The oxidation rate in the A4:Pd solution of (111) n-Si substrate, under the dark is much smaller compared to that of p-Si. Under about 100 mW/cm² visible light, the "growth" rate on n-Si was about the same, compared to the p-Si substrate. For both conductivity type (111) Si substrates, the thickness of the underlying Si substrate removed, is up to 25% of the oxide thickness, suggesting that a chemical deposition process is responsible for the formation of the chemical oxide. The A4:Pd solution was also tried for growing SiOX layers on (100) and (110) Si substrates. As mentioned above, the growth rates in these cases were much lower than that on (111) Si substrates. Because of this, on (100) Si substrates, the oxide grows preferentially at the defect areas, which reveal the (111) planes. This art-effect can be used for a non-destructive and very precise way of revealing the surface defects type and density on (100) Si surfaces.

One way to increase the growth rate is to add $H_2TiF_6$ or $TiCl_4$ or $(NH_4)_2TiF_6$ into the growth solution. For example the BS:Ti solutions, using $H_2TiF_6$ to enhance the growth rates of the RTWCG SiOX oxides on Si are made of 3 to 5 volume parts of 34% $H_2SiF_6$ mixed with 0 to 4 volume parts of 5% n-BPCl aqueous solution, 1 to 3 volume parts of 0.1 M $NH_4F$, 0 to 2 volume parts of 0.1 M NaF aqueous solutions and 0.5 to 2 volume parts of 60% $H_2TiF_6$. Then 0.1 to 1 g KFeCN/100 ml solution is added. The solution is agitated until complete dissolution of the KFeCN crystals.

Figure 2:
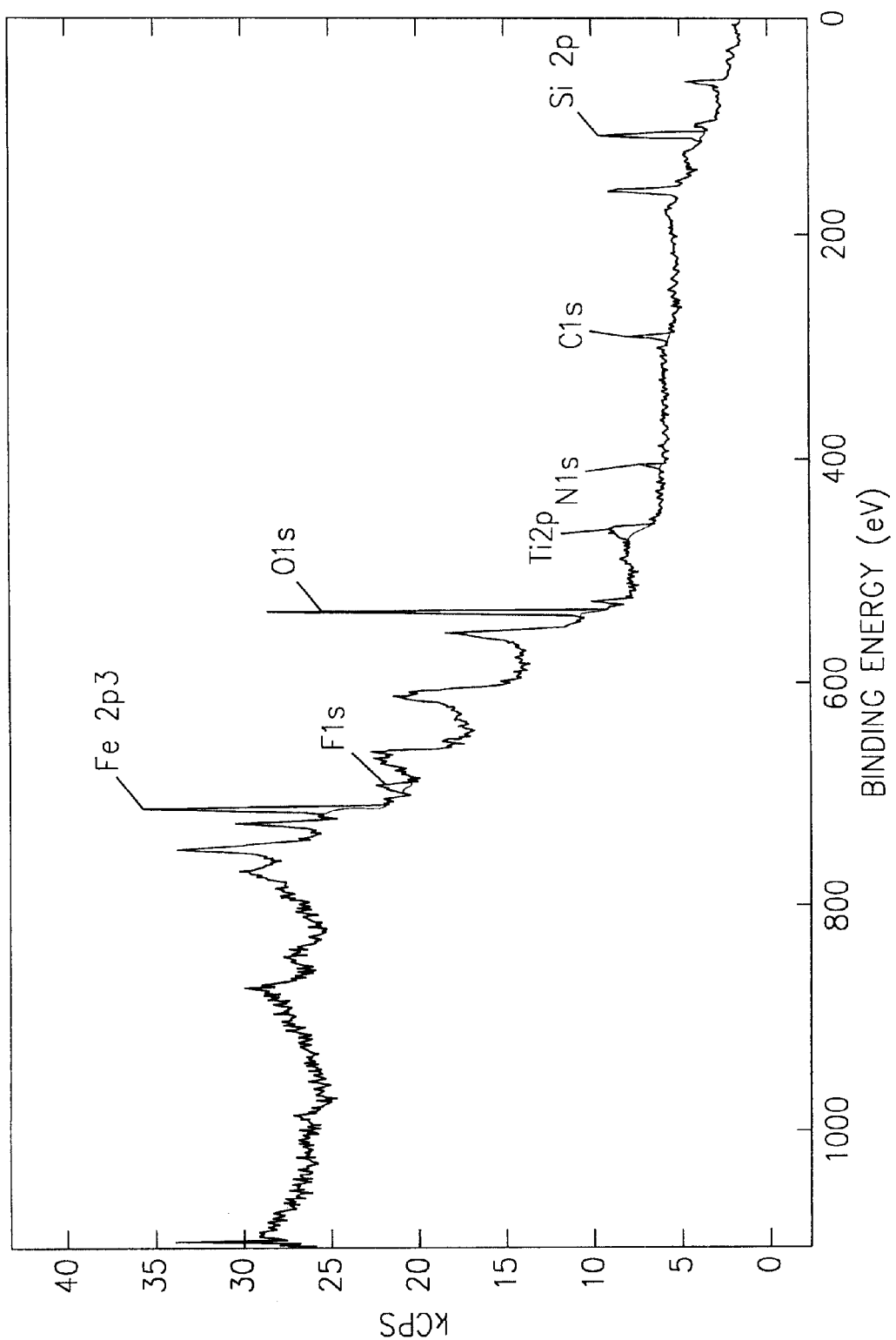
FIG. 2. is a XPS surface survey of an RTWCG SiOX oxide (235 nm thick), grown on p-type Si in BS-Ti34 solution, after the removal of about 13 nm from the surface.

FIG. 2. is a XPS surface survey of an RTWCG SiO oxide (about 70 nm thick), grown on p-type Si in BS-Ti34 solution. This growth solution was made by mixing 5 volume parts of 34% HSiF with 2 volume parts of 5% n-BPCl aqueous solution, 1 volume part each of 0.1 M $NH_4F$ and 0.1 M NaF aqueous solutions, 2 volume parts of 60% $H_2TiF_6$, and 1 g KFeCN/100 ml solution. The larger than needed $H_2TiF_6$ and KFeCN amounts in this example were chosen to study the oxidation stage of Ti and Fe included into the grown oxide. The growth time was 75 seconds, and the thickness of the oxide was 70.4 nm, therefore the growth rate was 56.3 nm/min. An oxide grown simultaneously in the same solution, but extracted after 5 minutes, had a thickness of 285 nm, giving a growth rate of 57 nm/minute. Table 2 gives XPS data recorded after sputtering 13 nm from the surface of the oxide in FIG. 2.

TABLE 2

Quantification Table for Experiment BS-Ti34. Sputtered 13 nm.

| Peak | Center (eV) | Norm. Peak Area | [AT]% |
|---|---|---|---|
| Fe 2p3 | 706.81 | 86.426 | 10.516 |
| F 1s | 688.5 | 28.363 | 3.451 |
| O 1s | 532.5 | 296.168 | 36.035 |
| Ti 2p | 397.4 | 31.531 | 3.836 |
| N 1s | 284.5 | 28.220 | 3.434 |

TABLE 2-continued

Quantification Table for Experiment BS-Ti34. Sputtered 13 nm.

| Peak | Center (eV) | Norm. Peak Area | [AT]% |
|---|---|---|---|
| C 1s | 284.5 | 89.368 | 10.874 |
| Si 2p | 102.5 | 261.813 | 31.855 |

Figure 3A:
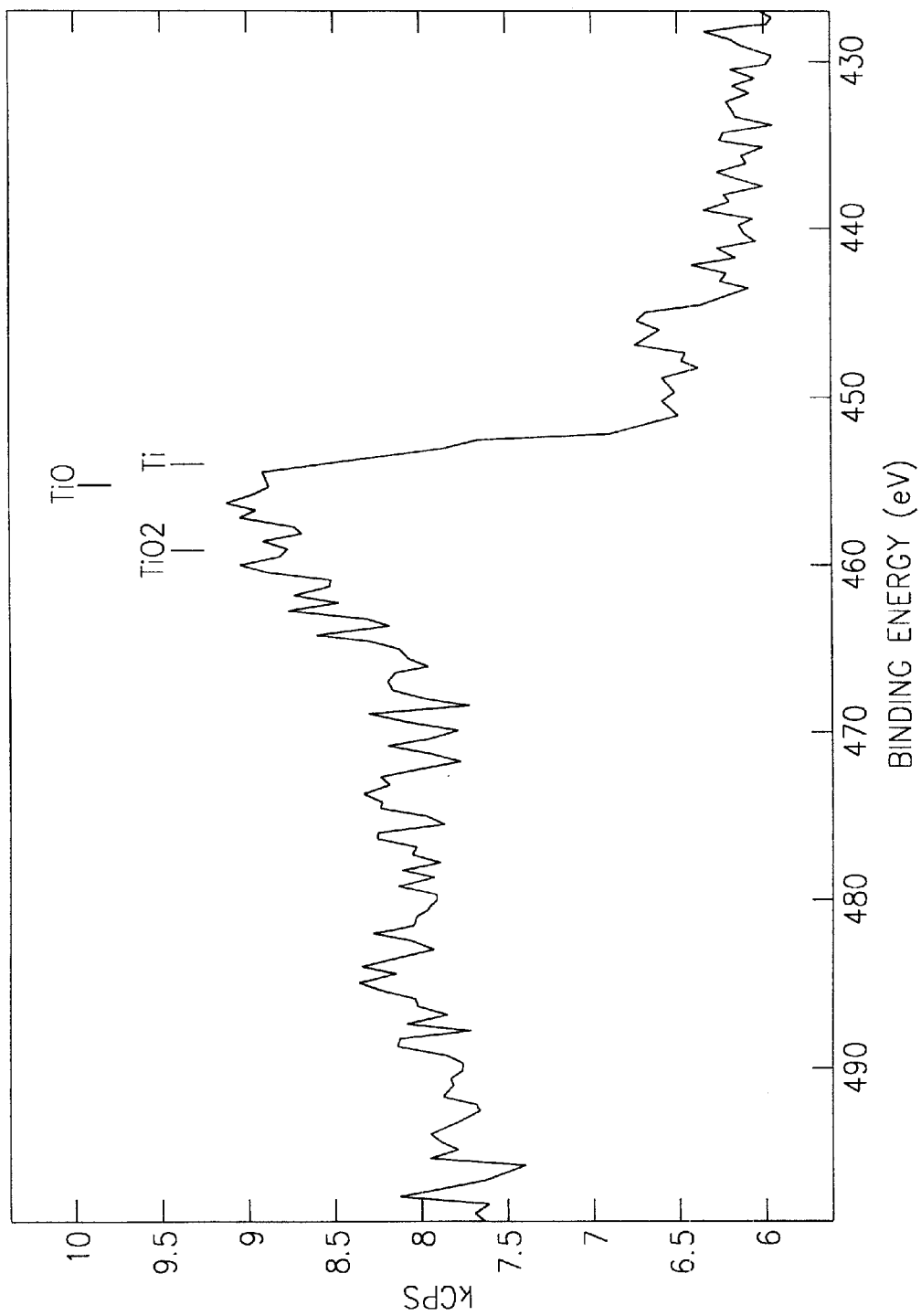
FIGS. 3a and FIG. 3b are clasp views of Ti and Fe windows in the survey in FIG. 2.
Figure 3B:
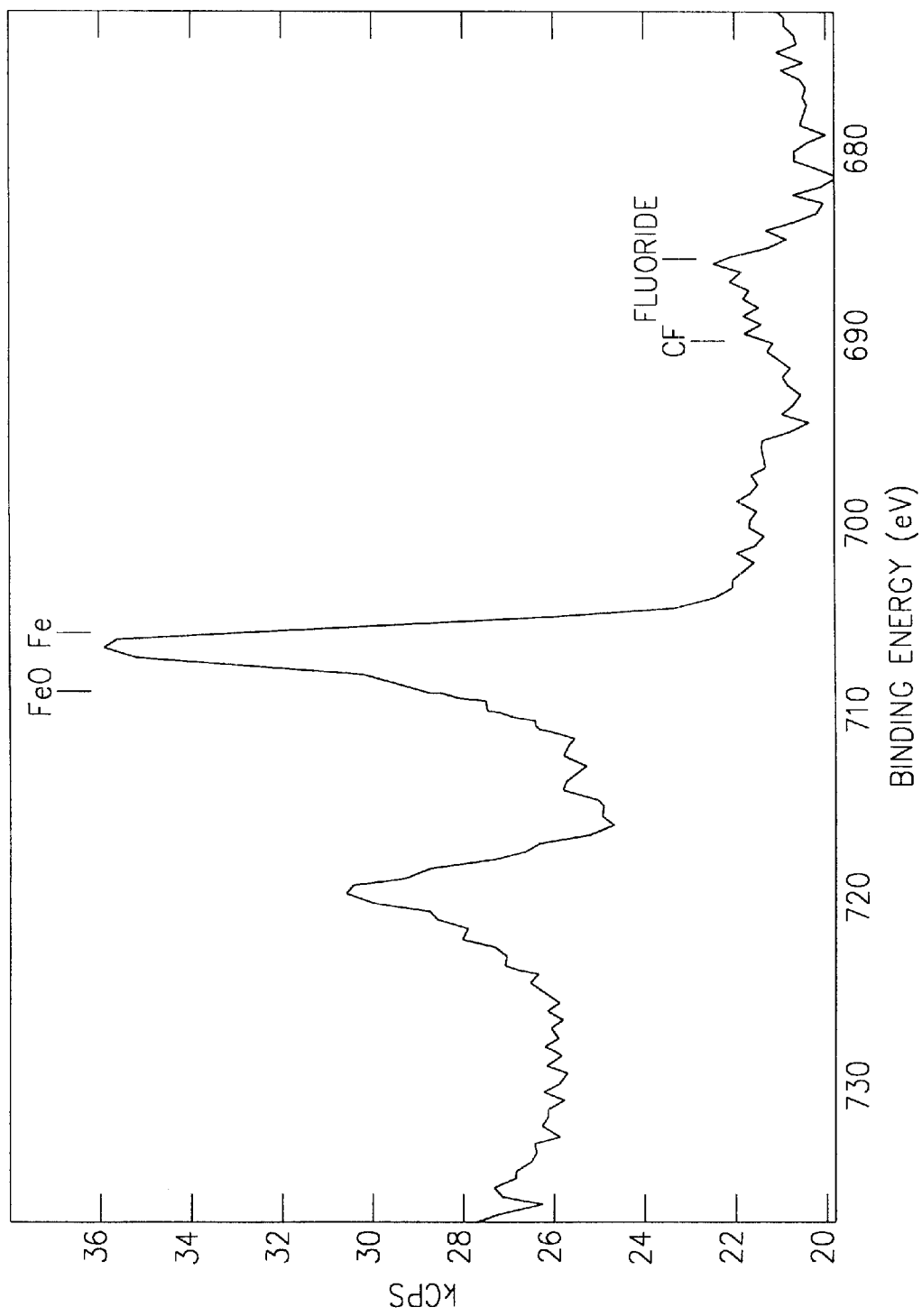

A depth profile of the above oxide components was acquired. At the surface the Fe, C and N concentration were about 11.5%, 38%, and 27%, respectively. In the top 26 nm their concentration steadily decreased to below 2% each, and their concentrations continued decreasing to zero toward the oxide/Si interface, except for the N, which still had a concentration of 0.58% near the interface. The Ti and F concentrations had a minimum at the surface of the oxide, e.g. 2.6% (Ti) and 0.15% (F), then their concentrations steadily increased to 40 nm, where they had a maximum of 4.8% (Ti) and 4.4% (F), and their concentration decreased steadily toward the interface, F with a larger rate. The large Ti and Fe concentrations should not recommend this oxide for most device applications, unless if the Ti and Fe exist as oxides. A closed examination of Fe 2p3, and Ti 2p peaks (FIG. 3a, and FIG. 3b), suggest that toward the surface of the oxide Ti and Fe are a mixture of metallic and oxide components. However, toward the oxide/Si interface both Ti and Fe appear to be completely in an oxide form.

In addition, growth solutions can be made which incorporate the use of redox solutions having an aqueous reduction oxidation solution which are based on bivalent and trivalent metals and more specifically, palladium, titanium, or platinum ions instead of, or in addition to, iron ions. Growth solutions have also been made, from which silicon oxide layers have been grown, using n,n-butylpyridinium chloride ($C_9H_{14}ClN$), or pyridine ($C_5H_5N$), or pyridine n-oxide ($C_5H_5NO$), or hydrogen fluoride-pyridine $C_5H_5N$ (HF). These growth solutions also contemplate the use of other pyridine compounds. As used herein "Pyridine compound" means a compound which is pyridine or includes a pyridine or pyridinium (i.e. a salt or complex of pyridine) constituent. These should specifically include pyridine and C1–C6 alkyl pyridine, such as ethyl pyridinium chloride, propyl pyridinium chloride, butyl pyridinium chloride, pentyl pyridinium chloride and hexyl pyridinium chloride, and other salts and complexes thereof as have been specifically called forth.

Prior to the RTWCG process, the growth solution was stirred using a magnetic stirrer for 10 minutes. Unless otherwise specified, prior to the SiOX growth, the surface of the Si substrate was cleaned using a standard RCA clean, and rinsed in deionized (DI) water for 5 to 10 minutes.

Using various standard RCA cleans prior to the SiOX growth, some of the films were not very uniform, and contained a large density of defects such as pinholes. In order to improve the uniformity while reducing or eliminating the defects, we have undertaken a systematic study of various pre-growth RCA cleans. The best results were obtained using a modified RCA (MoRCA) clean, as shown below.

Si Wafer Cleaning Prior to the RTWCG SiOX Process

Introduction

Surface preparation of silicon (SI) semiconductor wafers prior to the RTWCG of SiOX thin films will be referred to as wafer cleaning. Surface cleaning techniques used by the semiconductor industry are usually divided into four groups: front-end of line (FEOL), diffusion-end of line (DEOL), metallization-end of line (MEOL) and back-end of line (BEOL).

There are two basic types of wafer cleaning in use today: RCA-type wet cleans, predominantly used in FEOL and DEOL processes, and solvent-based cleans used in MEOL and BEOL processes. Of interest for surface cleaning of Si surfaces prior to RTWCG of SiOX films are the FEOL processes.

FEOL Cleaning

Although several new technologies (such as vapor phase cleaning, UV-assisted cleaning, cryogenic aerosol cleaning and, of course, plasma cleaning) show promise, the semiconductor industry still relies on wet processes for most FEOL cleaning steps, i.e. up to 40 cleaning steps during FEOL integrated circuit manufacturing.

The best known and most widely used FEOL cleaning process is the RCA cleaning sequence. W. Kern developed the basic RCA procedure in 1965 while working for RCA (Radio Corporation of America)—hence the name. The RCA cleaning of the silicon surface employs two steps called Standard Clean 1 (SC1) and Standard Clean 2 (SC2). In the SC1 step, wafers are exposed to a hot mixture of water-diluted hydrogen peroxide and ammonium hydroxide that removes organic surface films and particles. The traditional SC1 step has $H_2O_2:NH_4OH:H_2O$ (1:1:5)volume parts components in the solution. In the SC2 step, the silicon wafer is exposed to a hot mixture of hot water-diluted hydrogen peroxide and hydrochloric acid, which is designed to remove ionic and heavy metal atomic contaminants using a $H_2O_2:HCl:H_2O$ (1:1:6)volume parts solution. Removal of a thin silicon dioxide layer where metallic contaminants may accumulated as a result of SC1, is done using a diluted $HF:H_2O$ (1:50) volume parts solution.

One reason for the modified RCA wet clean's continued success is the availability of ultra high purity water (UHPW) and chemicals. Beyond increased chemical purity, the most significant trend with regard to the RCA clean is the use of more dilute mixtures in an effort to reduce surface roughening. SEMATECH's J80 program, a joint program between IBM, National Semiconductor, Motorola and CFM Technologies, for example, showed it is possible to achieve substantial improvement in cleaning performance while utilizing much more diluted chemistries than conventionally used. Today very few leading edge companies still run the traditional 5:1:1 $NH_4OH/H_2O_2/H_2O$ or $HCl/H_2O_2/H_2O$ for SC1 and SC2, respectively. Many of them are at least 10 times more dilute.

In a similar vein, IC manufactures and independent research organizations, such as IMEC in Belgium and Tohuku University in Japan, have been working completely eliminate one or more wet cleaning steps for some applications. IMEC, for example, has shown that the standard SC2 solution can be replaced with dilute 0.1 mole/liter HCl without H2O2, cutting chemical consumption and cost while maintaining metal removal efficiency.

Improved Si Wafer Cleaning

In order to improve the uniformity of the RTWCG SiOX films we tried various known surface cleaning techniques. For example, in order to reduce the chemicals and water consumption while improving the uniformity of the SiOX film, we tried an improvement to the RCA clean that was unveiled by Mallinckrodt Baker and Motorola (Semiconductor International September 1995, p.18). This new cleaning process, dubbed the "Baker Clean," employs the use of TMAH (tetramethyl ammonium hydroxide) that is said to be simpler, more efficient and more stable than the RCA clean. However the uniformity of the RTWCG SiOX film was not as good as when dilute RCA clean was used.

The FEOL Si wafer cleaning sequence which gave the best results in terms of SiOX film uniformity is a modification of the traditional RCA cleans, by including the generally known in the art use of "Piranha" and HF steps before, after and between the SC1 and SC2 cleaning steps sequence. Within the present work we introduced MoRCA and MoPiranha: Modified RCA and Modified Piranha formulations that gave the best results in improving the RTWCG SiOX thin film uniformity and reducing the defect (e.g. pinholes) density within the films. Also, the concentration of the HF, NH4OH, H2SO4 and HCl aqueous solutions we used is lower as compared to the traditional RCA clean. This has the added environment, safety and health (ESH) and cost benefits of reduced chemical use and waste disposal. The diagram below shows the Si wafer cleaning sequence incorporating these additional steps and concentration modifications.

The improved cleaning sequence includes multiple rinse steps using solutions of: $H_2SO_4$, $H_2O_2$ and $H_2O$, NH4OH, $H_2O_2$ and $H_2O$ and HCl, $H_2O_2$ and $H_2O$, each being followed by rinses with water and aqueous solutions of 0.1 to 1.0 HF by weight. More particularly, the cleaning sequence includes the steps of a rinse with a solution of $H_2SO_4$, $H_2O_2$ and $H_2O$, NH4OH, $H_2O_2$ and $H_2O$, followed by a $H_2O$ and a HF rinse; a rinse of NH4OH, $H_2O_2$ and $H_2O$, followed by a $H_2O$ and a HF rinse; and a rinse of HCl, $H_2O_2$ and $H_2O$, followed by a $H_2O$ and a HF rinse.

The $H_2SO_4$, $H_2O_2$ and $H_2O$ is at a ratio of about 1–10:1:40–100 parts by weight. Note that these ranges are based on the given weight percentages, the NH4OH, $H_2O_2$ and $H_2O$ is at a weight ratio of 1–10:1:50–150, and the HCl, $H_2O_2$ and $H_2O$ is at a weight ratio of 0.05 M HCl:30% $H_2O_2$ (25:1)

The MoRCA cleaning sequence that gave the best RTWCG SiOX thin film uniformity and defect density, was found to be the following:

MoPiranha {[98% H2SO4:30% H2O2:$H_2O$](2:1:20)}, 3 to 5 minutes at 50 to 60 C.

UHPW rinsing 0.5% HF, 1 minute

UHPW rinsing

MoRCA, SC-1 {[NH4OH:H2O2:H2O](3:1:25)}, 3 to 5 minutes at 50 to 60 C.

2×UHPW rinsing 0.5% HF, 30 seconds

UHPW rinsing

MoRCA, SC-2, {[0.05 mole/liter HCl:$H_2O_2$](25:1)}, 3 to 5 minutes at 50 to 60 C.

UHPW rinsing 0.5% HF, 30 seconds

UHPW rinsing

N2 Drying

As used above

MoRCA refers to Modified RCA and MoPiranha refers to Modified Piranha.

UHPW refers to Ultra High Purity Water.

All chemicals should be reagent grade or better purity, except for the SC-2 chemicals, which should be semiconductor grade.

Chemical composition of the SiOX thin films was derived from the X-ray Photoelectron Spectroscopy (XPS) and Auger Electron Spectroscopy (AES) data, the depth corresponding in all the XPS and AES depth profiles of SiOX thin films is calculated in reference to a $Ta_2O_5$ oxide. Ellipsometric data on selected samples and Dektak profiles of etched features show that the real thickness of the SiOX film are over 2 times higher than those corresponding in the absence of the XPS profiles. Dektak determinations of chemically etched SiOX thin films, performed for several hundred samples indicate that the thickness of the SiOX films are about 2.2 times higher than the corresponding XPS depths shown in the XPS depth profiles, referenced to $Ta_2O_5$. In order to avoid any confusion, unless otherwise specified, all depths and the growth rates, respectively, in the following discussion will be referenced to $Ta_2O_5$. Therefore the real thickness and growth rate in each case can be calculated by multiplying the XPS depth and XPS generated growth rate by 2.2.

EXAMPLE 1

Low Dielectric Constant SiOX Thin Films for Intermetallic Dielectric (IMD) and Interlevel Dielectric (ILD) for Ultra Large Scale Integrated (ULSI) Silicon Based Microelectronics Integrated circuit miniaturization continues to well below the half-micron level in the quest for higher speed and greater efficiency. At such reduced dimensions, the relatively high dielectric constant and resulting capacitance of conventional interlayer dielectric materials work to limit signal speed, create cross-talk and consume excessive power.

In the last two decades or so, there has been a continuous search for an alternate gate dielectric to $SiO_2$ grown by thermal oxidation, needed for a series of applications such as the high speed, high performance large scale integrated (LSI), very large SI (VLSI) and ultra large SI (ULSI) circuit processes. The search continues for alternate to $SiO_2$ layers and process technologies for 0.25 μm and beyond microelectronics. The high-density plasma CVD (HDP-CVD) deposited SiOF has already been used to fill 0.35 μm gaps, and is also a contender for the 0.25 μm and even for the 0.18 μm gaps, although it has proven very difficult to implement even for the 0.25 μm gaps due to problems associated with the chemical-mechanical planarization (CMP) process. Hence, a selective growth of SiO-based films for fully planarized multilevel interconnections so as to eliminate the CMP process is very attractive for VLSI and ULSI device applications.

For 0.25 μm, 0.18 μm, 0.13 μm, 0.10 μm and beyond, work is under development on a variety of materials that can provide dielectric constants between 2 and 3 (e.g. fluorinated polymides; non-polymide C—H polymers; fluoro-polymers; siloxane polymers and parylenes, to name a few). All of these materials are just now beginning to be fully characterized, and thus far, the biggest common concern is their relatively poor thermal stability.

The main disadvantages of conventional insulating films for VLSI (ULSI) applications include:
1. poor compatibility with multilevel interconnection,
2. postdeposition planarization introduces stress, as well as chemical and particle contamination,
3. relatively poor thermal, UV, and plasma stability,
4. high temperature; low growth (deposition) rate,
5. relatively poor step coverage,
6. high investment cost.

Using the RTWCG process we were able to grow SiOX insulator layers on 2 to 4 inch (100) and (111) p-Si and n-Si substrates. These insulator layers have:
1. a thickness from about 0.01 to 0.90 μm (as determined from ellipsometry),
2. a growth rate of up to 64 nm/min.,
3. measured static dielectric constant between 2.95 and 4.8,
4. very good uniformity,
5. good chemical and thermal stability.

Figure 4:
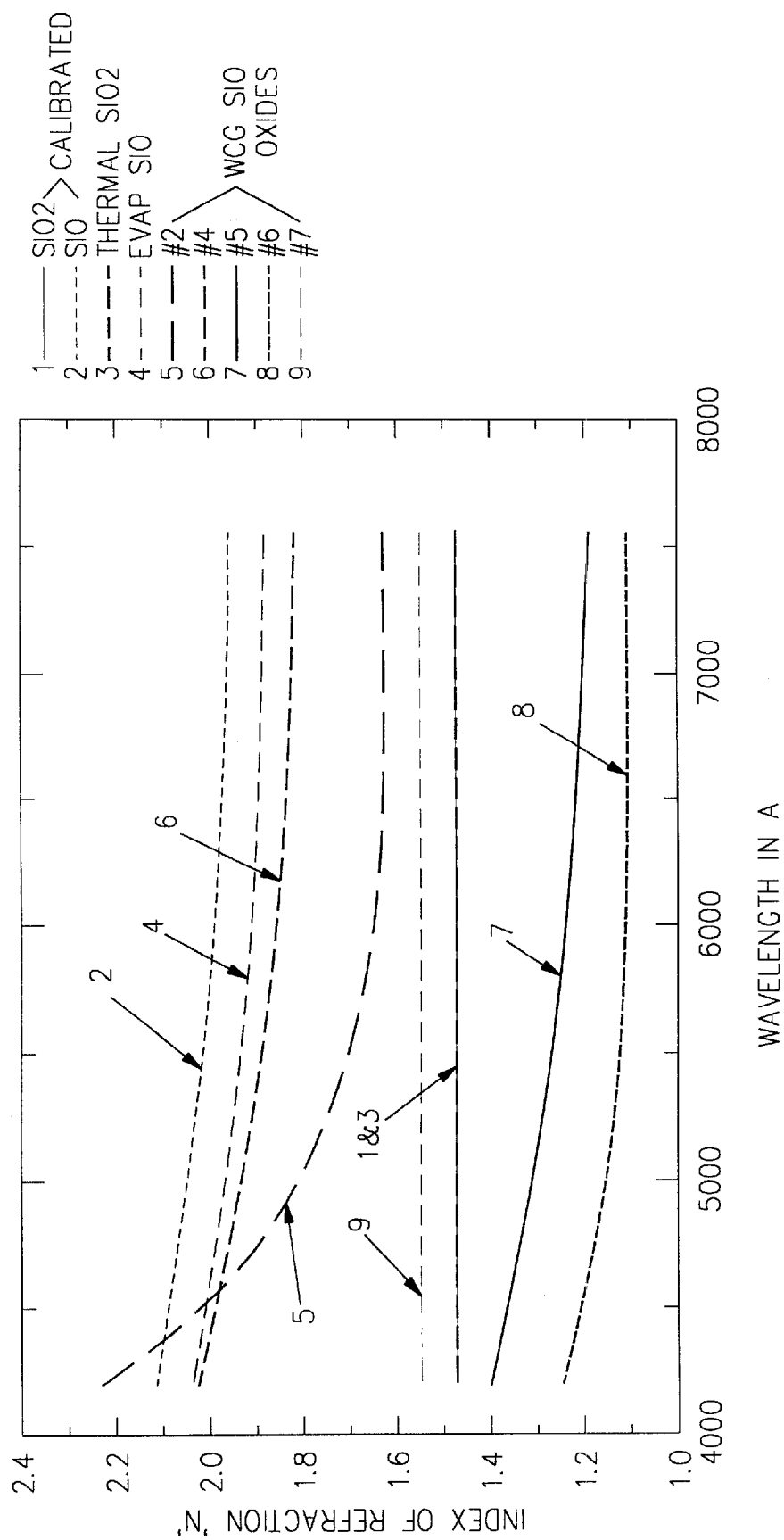
FIG. 4 are plots of index of refraction against wavelength for selected RTWCG SiOX-based thin film oxide layers grown on (111) p-type silicon substrates.

In FIG. 4. are given plots of ellipsometric data of five selected SiOX chemical oxides. For comparison, are also given plots for a thermally oxidized $SiO_2$ and resistive evaporated SiO, respectively, grown/deposited on similar p-Si substrates.

In developing the WCG processes for room temperature growth of SiOX based insulators, the chemical composition and the chemical structural features of the liquid molecules must ensure the proper length, reactivity, permanent dipole momentum and surface tension so as to allow uniform growth of stable oxide layers of controllable composition and thickness. For example because the insulator film is grown in liquid state, if the liquid precursors of the growth solution are properly selected, the surface tension forces inside spaces with critical features of 0.25 μm and beyond, and high aspect ratio, will pull the film flat—a self-planarization effect. This is extremely important for developing self-planarizing growth processes of intermetallic dielectric films, interlevel dielectrics, and shallow trench isolation of ULSI Si-based micro- and nano-electronics.

The above requirements necessitate complex interdisciplinary theoretical and experimental studies of fluid dynamics, electrochemistry, physics of the interfaces, etc. For instance, the flow and range of interaction forces between complex liquids and the nanostructure surfaces cannot be solved by the known dynamic and kinetic-molecular theories of liquids. Moreover, the Laplace type forces, determined by the internal fluid pressure, are drastically modified by the physical-chemical interactions of complex liquid molecules with the surfaces of the nano-structures with various geometries.

We have been able to prove that the RTWCG SiOX oxide layers can be made compatible with metallization schemes, including Cu and Ag, and photoresists. Due to its excellent gap filling capability, this room temperature process could become the process of choice for fully planarized multilevel interconnections for ULSI microelectronics with high aspect ratio and features size of 100 nm and beyond, for which none of the presently known techniques seem to work.

For measuring the static dielectric constant, we fabricated MOS capacitors using RTWCG SiOX oxides. For the fabrication of Al/as-grown RTWCG oxide/p-type Si/Au:Ti MOS capacitors (with gate areas from $2\times10^{-4}$ cm$^2$ to $2\times10^{-3}$ cm$^2$), the SiOX oxides were grown after the ohmic back contacts were made, and no further annealing steps were used in the fabrication of MOS capacitors. We also fabricated MOS capacitors using thermal $SiO_2$ so as to check the validity of our measured values. The thickness of the SiOX and $SiO_2$ layers was measured using a Dektak profiler.

Table 3. gives the solution growth, the oxide thickness for the reference thermal $SiO_2$ and selected RTWCG SiOX oxides, the average refractive index (400 to 800 nm wavelength range) as determined from ellipsometry, and the static dielectric constant, measured at 1 MHz.

TABLE 3

Static dielectric constant vs. average refractive index in the visible spectra (1 = 400 to 800 nm) for RTWCG SiOX oxides grown on (100)p-Si. Growth time: 4 to 25 minutes.

| Solution | Oxide Thickness (nm) | Av. Refractive Index | Dielectric Constant |
|---|---|---|---|
| Thermal SiO | 108 | 1.492 | 3.95 |
| BS:Ti | 107 | 1.353 | 2.95 |
| A4:Pd | 135 | 1.492 | 4.33 |
| BS-Ti34 | 801 | 1.542 | ~4.80 |

EXAMPLE 2

RTWCG of SiOX Thin Films for Gate Dielectric for ULSI Silicon Based Microelectronics In the last two decades or so, there has been a continuous search for an alternate gate dielectric to $SiO_2$ grown by thermal oxidation, needed for a series of applications such as high performance ULSI. The $SiO_2$ has already been replaced by slightly modified $SiO_2$, i.e. oxynitrides.

For the development of electronic devices with critical features below 100 nm, the thickness of the insulator layers has to be scaled down accordingly, but retain its passivating and dielectric properties. As an example, for use as a gate dielectric of modern MOS transistors the oxide thickness will be in the range of 6–10 nm for 0.35 $\mu$m generation technologies and will scale to less then 4 nm for 100 nm and beyond technologies. To our knowledge none of the already developed or recently proposed insulator layers would satisfy the technological requirements of high-speed, low-power nanoelectronics with critical features of below 100 nm.

EXAMPLE 3

SiO-based Insulator for Surface Passivation for Photonic (Optoelectronic) Device Applications If the insulating layer is deposited directly on the Si surface, it is imperative that it provides good passivation of the surface. This is an important aspect, very often overlooked in developing insulator layers. This is difficult to achieve for future IC electronic and optoelectronic structures with shrinking feature size using traditional dielectric growth/deposition techniques. Based on our preliminary data, if well controlled, the SiOX oxides grown by the new RTWCG technique will have better passivating properties of Si surfaces compared, for example, to inorganic and organic spin-on glasses because the chemical growth should result in uniform and well-defined noncrystalline layers with short range order.

As mentioned in Example 2, the RTWCG SiOCN oxide grown in solution BS-Ti34 has excellent chemical, UV and thermal stability, and, respectively, excellent surface passivation capability. Its passivating qualities were tested on some n+p Si solar cells. Using solution growth BS-Ti34 and a growth time of 4 minutes, we grew a 72 nm thick SiOCN oxide on two 4 $cm^2$ Si solar cells. On one of these cells we recorded a gain of 63.2% in short circuit current density ($J_{sc}$) e.g. from 23.69 $mA/cm^2$ (bare surface) to 38.66 $mA/cm^2$. This gain was much larger than that expected from the decrease in the reflectivity. For another cell, in similar conditions, we recorded a gain in $J_{sc}$ of 62.8% (oxidized simultaneously with the cell above). After removing the oxide from the surface of the first cell, the $J_{sc}$ became 32.1 $mA/cm^2$, compared with the initial value of 23.69 $mA/cm^2$. This relative increase of about 36.5% we attribute to surface passivation of this bare Si cell, which means that the increase due to the difference in reflection is only about 27%. This is comparable or better with reported increases in $J_{sc}$ using a single layer AR coating.

EXAMPLE 4

SiO-based Insulator for Use as a Single Layer Antireflection Coating for Si-based Planar Solar Cells The anti-reflective (AR) coating is one of the most important parts of a solar cell design, as it allows a substantial reduction in the amount of reflected light. For Si, the loss of incident light amounts to 34% at long wavelength (1.1 $\mu$m) and rises to 54% at short wavelength (0.4 $\mu$m). A proper single layer AR coating can reduce the reflection to about 10%, averaged over this wavelength range, and a double layer AR coating can reduce it to around 3% on the average.

It is a common practice to use physical vapor deposition techniques to deposit the AR coating. For simple cell structures, the layers of AR coating are deposited directly onto the emitter surface by resistive or e-beam evaporation, sputtering and chemical vapor deposition. The most common single layer AR coatings are $MgF_2$, $SiO_2$, SiO, $TiO_2$ and $Ta_2O_5$. For high efficiency space solar cells, the most commonly used double layer AR coating is $ZnS/MgF_2$. All of the above deposition methods are known to destroy the stoichiometry at the cell's front surface, which, by increasing the scattering at the grain boundaries, decreases the AR coating/semiconductor interface transparency and introduces additional defects at the emitter/AR coating interface. For this reason, high efficiency III-V based space solar cells use a window layer grown on the surface of the emitter prior to depositing the layers of the AR coating. This window layer partially reduces the degradation effects mentioned above. Lattice-matched window layers are grown by epitaxy; this increases the cost and reduces the yield of finished cells. Radiation induced defects at the window/emitter layer interface is an additional concern for the design engineers of space solar cells.

We started a preliminary investigation to test the overall quality of large growth rate RTWCG SiOX oxides using BS solutions such as, BS-Ti34 by using them as passivation/first layer AR coating for planar Si cells.

For our preliminary study we used several dozen readily available planar 2×2 $cm_2$ n/p Si solar cells with AMO, 25 degree C. and efficiency of about 7% (bare cells). Before the measurements, the front surfaces of the bare cells were cleaned with organics, followed by a short dip into a 2% HF solution. RTWCG SiO-based coatings were then grown in the BS-Ti34 chemical system.

Figure 5:
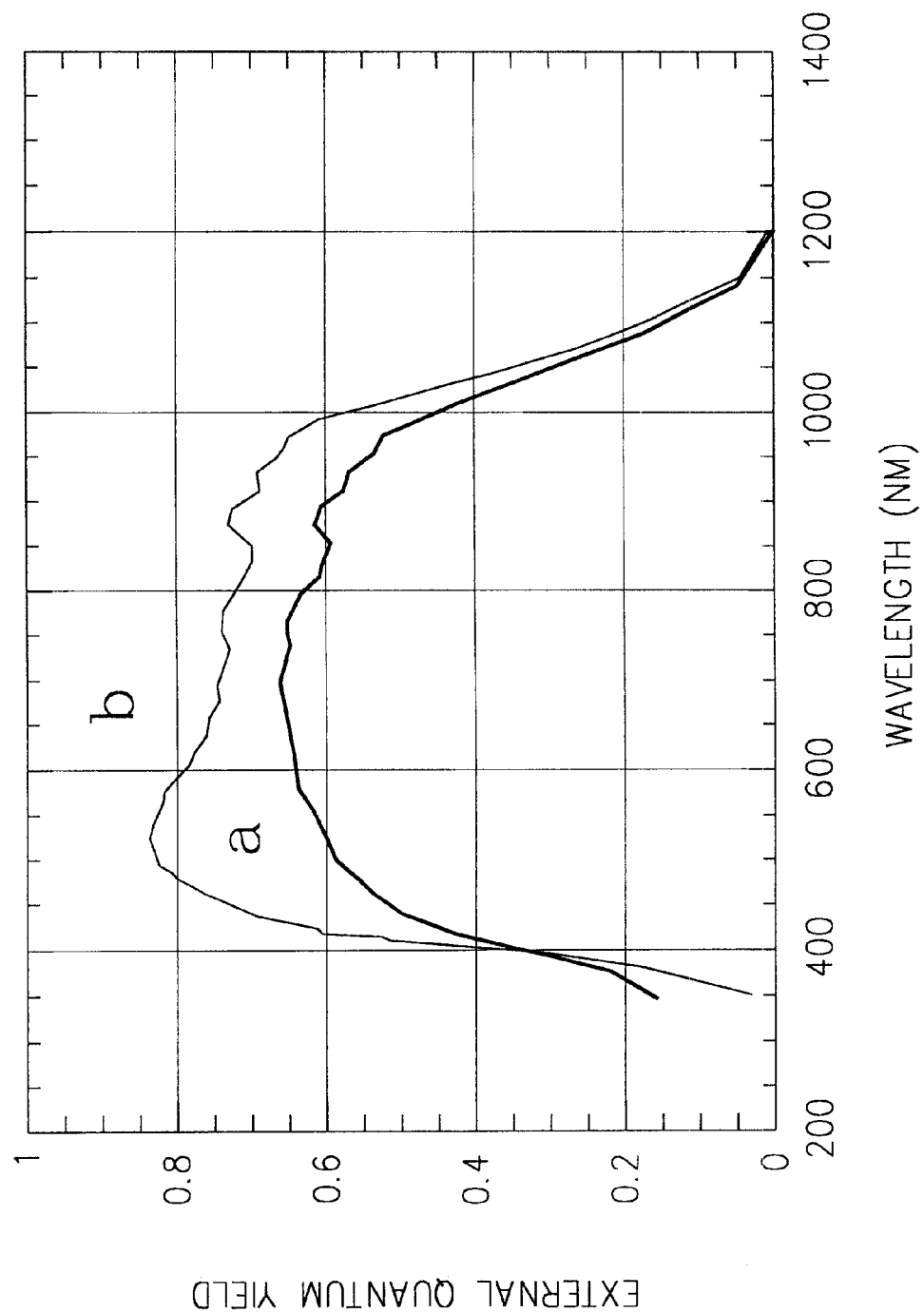
FIG. 5 are plots of external quantum efficiency against wavelength for a 4 $cm^2$ Si solar cell with (a) bare and (b) RTWCG SiOX-based AR coating.

The variation in external quantum efficiency of one such bare cell (a) before, and (b) after, the RTWCG SiOX oxide grown in the BS-Ti34 chemical system is shown in FIG. 5.

The performance parameters, a selection of which are given in Table 4, were measured at NASA LeRC prior to and after the coatings, under AMO, 25 degree C. conditions.

TABLE 4

AMO, 25 degree C performance parameters of selected 2 × 2 cm² n/p Si cells prior to (bare) and after RTWCG of SiO-based coatings in the BS—Ti34 chemical system. Growth time: 3 to 5 minutes; thickness: 95 to 120 nm; no annealing.

| | Bare Cell | | | | Coat. Cell | | | | |
|---|---|---|---|---|---|---|---|---|---|
| Cell | $I_{sc}$ (mA) | $V_{oc}$ (mV) | FF (%) | η bare (%) | $I_{sc}$ (mA) | $V_{oc}$ (mV) | FF (%) | η ox (%) | η (ox- η bare)/ η bare (%) |
| Cox 12 | 89.2 | 583.9 | 75.2 | 7.16 | 118.0 | 579.5 | 75.0 | 9.45 | 32.0 |
| Cox 27 | 88.0 | 573.1 | 70.4 | 6.49 | 117.2 | 572.7 | 71.8 | 8.81 | 35.7 |
| Cox 23 | 88.3 | 570.9 | 68.7 | 6.33 | 119.9 | 571.0 | 69.5 | 8.69 | 37.3 |

After the SiO-based coatings, the only treatment the cells received prior to the AMO measurements was rinsing them with DI water and drying them in $N_2$. The large increase in the efficiency of these cells, after the RTWCG SiO-based coatings, are due to a very good optical quality of coatings grown in the BS-Ti34 chemical system. The passivating property of this coating is better than that of some commercial AR coatings. The SiOX oxide used for cell "12" in Table 4 was grown in identical conditions as the one in FIG. 2. The coating used for cell "23" had lower concentration of metallic Ti, compared to cell "12" as revealed by the better defined $TiO_x$ peaks, with a smaller shoulder toward the metallic Ti.

As seen in Table 3, by varying the chemistry of the solution growth it is possible to deposit SiOX AR coatings with tailorable index of refraction by including various amounts of Ti—O and N—O groups into the SiOX layer. RTWCG of SiOX coatings is possible on surfaces with existing metallization such as with grid fingers on solar cell or thermophotovoltaic (TPV) cell surfaces. Therefore, once metallization has been done on the cell, and after chemical removal of nonstoichiometric front surface layers, insulating WCG SiOC coatings can be used for the dual purpose of surface passivation and as AR coating.

Note that $I_{SC}$ values for the cells in Table 4, increase significantly after RTWCG of SiO-based coating, while the $V_{OC}$ values remain practically unchanged. The explanation might have to do with the fact that the surfaces of the 10–15 year old planar cells could not be properly cleaned, prior to growing the SiO-based coating, without removing some or all front grid fingers. For these cells, using mild acidic solutions of the BS:Ti34 type chemical system, it should possible in one step to remove the nonstoichiometric (dead) front surface layer, passivate the surface, and grow a good quality AR coating.

EXAMPLE 5

RTWCG SiOX Based Insulators for Use as a Passivating/Single Layer Antireflection Coating for Si-based Concentrator Vertical Multijunction (VMJ) Silicon Solar Cells Light-induced effects in the Si/insulator interface are known to adversely affect the solar cell performances. Although these light-induced effects especially affect surface sensitive devices, such as the silicon inversion layer solar cells, these effects have also been reported for high efficiency silicon point-contact solar cells after extended exposure to concentrated sunlight. The light-induced degradation is due to the generation of fast surface states at the silicon/insulator interface. For terrestrial solar cell applications, this effect can be minimized, since cover glass and suitable encapsulants act as a filter cutting off the energetic wavelengths (<335 nm) which are mainly responsible for light induced degradation of solar cell performances. For concentrator solar cells in general and point-contact and VMJ Si solar cells in particular, however, these effects cannot be neglected.

Vertical MultiJunction (VMJ) Si solar cells, (U.S. Pat. Nos. 4,332,973; 4,409,422, and 4,516,314) show a good promise for use as concentrator solar cells. One of the biggest challenge in fabricating high efficiency, stable VMJ cells is the difficulty, using traditional techniques, to passivate the two back and front surfaces, and the two non-metallized edge surfaces.

For this preliminary experiment, some early Vertical MultiJunction (VMJ) Si solar cells were provided to us by the VMJ Si solar cell developer, PhotoVolt, Inc. The biggest contributor to efficiency loss in the Si VMJ cell structure is the fact that its illuminated and back surfaces, and the two edge surfaces uncovered by metallization, are high recombination surfaces with exposed junctions that are difficult to passivate. Also, traditional AR coatings are difficult to form on these cells because of temperature constraints and because of their configuration with the four exposed surfaces. The RTWCG process grows SiO-based oxides simultaneously on the four exposed surfaces. These coatings, grown at room temperature, are easy to apply, are stable, passivate well the VMJ Si cell surfaces, and act as an effective AR coating. Some results are given in Table 5.

TABLE 5

$I_{SC}$ and $V_{OC}$ of two VMJ Si cells after chemical passivation (by Photo Volt) of bare cells, and after RTWCG of SiOX coatings. Growth time: 4 minutes; Oxide thickness: about 120 nm. No annealing.

| | Bare Cell | | Coat. Cell | | | ($V_{oc}$,ox– |
|---|---|---|---|---|---|---|
| Cell | $I_{sc}$ (mA) | $V_{oc}$ (V) | $I_{sc}$ (mA) | $V_{oc}$ (V) | ($I_{sc}$,ox–$I_{sc}$,bare)/ $I_{sc}$,bare (%) | $V_{oc}$,bare) $V_{oc}$,bare (%) |
| PV 414 | 0.398 | 12.57 | 0.52 | 14.22 | 30.7 | 13.1 |
| PV 412 (Side 1) | 0.385 | 13.31 | 0.56 | 14.55 | 45.6 | 9.3 |
| PV 412 (Side 2) | 0.425 | 13.17 | 0.57 | 13.95 | 34.1 | 5.9 |

VMJ Si solar cells with their multiple (16 to 40) exposed junctions are probably the most surface sensitive solar cells. The biggest contributor to efficiency loss in the Si VMJ cell structure is the fact that its illuminated and back surfaces are high recombination surfaces with exposed junctions (up to 40) which are difficult to passivate. After the SiOX coatings, the only treatment the cells received prior to the AMO measurements was rinsing them into DI water and drying them in $N_2$. The RTWCG SiOX coated VMJ cells surpassed the performances and UV stability of cells with resistively evaporated $Si_3N_4$, SiO and $Ta_2O_5$ AR coatings. We attribute this to the intrinsic good passivating and optical quality of the RTWCG Si—O—C—N oxide.

On some Si VMJ cells with $Ta_2O_5$ as an AR coating, after a 1 hour exposure to high intensity (about 50 mW/cm$^2$) near UV light, the drop in the performance parameters was as high as 20%. After the exposure, the cell performance parameters completely recovered after only about 30 minutes, which suggests that fast surface states at the $Ta_2O_5$/Si interface were responsible for the performance parameters drop. After removing the $Ta_2O_5$ layer, passivating the surfaces using a RTWCG SiOCN oxide (solution BS:Ti34), the cell performance parameters increased by as much as 50%. Additionally, no UV degradation was observed even after exposure to the aforementioned halogen light for as long as 5 hours. In fact, for some cells, with similar surface treatments, measurements performed in the PV branch at NASA LeRC under AMO, 25 degree C. conditions, even showed a small increase in performance parameters after prolonged light exposure.

For solar cell and especially for surface sensitive solar cell applications, such as vertical multijunction (VMJ) solar cells, the surface recombination velocity has to be made as small as possible. This means that metallic and carbon impurities' concentration must be kept low at the oxide/semiconductor interface. The amount of Fe or Ti present in some of our SiOX oxides should be kept at a very low level.

EXAMPLE 6

SiO-based Insulator for Use as Passivating Films for Porous Silicon Coated Photonic (Optoelectronic) Devices Chemical stabilization of the porous silicon (PS) material and conservation (or enhancement) of the luminescence efficiency are two current challenges confronting the development of porous-silicon-based photonic (optoelectronic) device applications.

Good chemical stability is obtained upon oxidizing the PS surface, either thermally or by anodic oxidation. This does not appear as a promising route for device application because it impedes electrical carrier injection. On a single-crystal planar silicon surface, the hydride passivated surface is known to exhibit a fair stability against oxidation and contamination, at least on a time scale of a few hours. In contrast, the PS surface is much more prone to oxidation and contamination, and, especially for high porosity samples, the infrared spectra exhibit traces of contaminated native oxide formation, after a few minutes in air. On the other hand, on flat silicon crystals, methloxylation of the surface has been reported as a key factor in order to account for the long-term stability and the low interfacial recombination characteristics in methanol-based photoelectrochemical cells. Similar modifications of the porous silicon surface then appears highly attractive since it might provide a much more stable surface which could be used as a processing step for device applications. In a recent study, after formation of PS in concentrated HF electrolyte, methoxy groups were formed through partial anodic dissolution of the hydrogenated PS surface in anhydrous methanol. The methoxylated surface exhibited improved optical characteristics (increased photoluminescence efficiency and blue shift of the emission), similar to PS anodically oxidized in a nonfluoride aqueous electrolyte. Its stability against aging was also improved as compared to that of the hydrogenated surface, but without reaching the stability of anodically oxidized PS. The relative instability is ascribed to the amount of SiH species, which remain, on the methoxylated surface upon the modification process.

Basic properties of PS, such as photoluminescence (PL) origin, formation mechanism, and structure, have been extensively studied. Meanwhile, the fundamentals of PS devices are being developed. It is important to develop a corresponding device technology for PS that is compatible with the conventional integrated circuit technology. For example, a key step in the fabrication of PS devices and integrated optoelectronic circuits is the formation of light emitting patterns. This is a difficult process because any postprocessing will seriously affect the properties of PS due to its porous, fragile, and chemically reactive structure. A research team from the University of Rochester and the Rochester Institute of Technology, N.Y. have managed for the first time to integrate a PS light emitting diode (LED) into a conventional microelectronics device" (Semiconductor International, January 1997). The LED is said to be 10,000 times more efficient than the first PS Si LED, fabricated in 1990. The improvements they are envisioning will further boost the efficiency 10-fold and increase its frequency 100-fold. To achieve this, as a first step, we feel they should consider replacing the Si-rich $SiO_2$ layer they are presently using with a better passivating layer and with a lower dielectric constant. The use of Si-rich $SiO_2$, although compared to $SiO_2$ offers the advantage of better withstanding some postprocessing steps such as etching, it is not a good choice for surface passivation, has lower resistivity and dielectric strength, higher dielectric constant, and should be less stable with respect to plasma processing, UV and ionizing radiation.

Recently we started a very preliminary study on the possibility of increasing the stability of PS material against aging using RTWCG grown SiOCN-rich thin film coatings for photonic (optoelectronic) device applications, and in particular for low reflection passivated front surface formation for Si solar cell applications. The PS was formed chemically on (111) and (100) Si substrates, using a solution based on HF and $HNO_3$.

Figure 6:
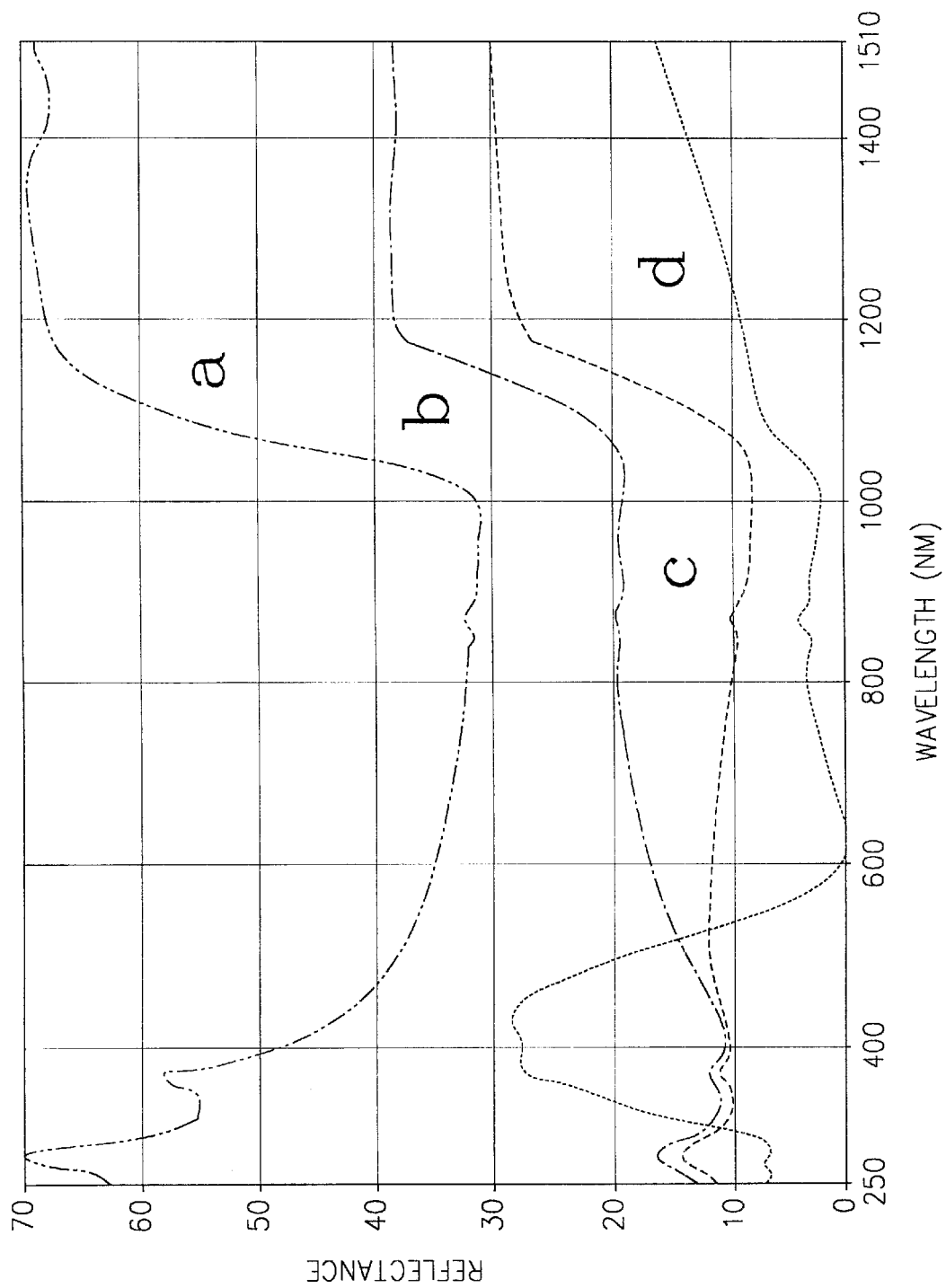
FIG. 6 are plots of reflectivity against wavelength of (a) RCA cleaned (100) p-type Si, (b) PS coated, (c) RTWCG SiOX passivated PS using a solution A4-Pd, (d) RTWCG SiOX.

A RTWCG of thin SiOX layers were grown at room temperature. In FIG. 6 are shown reflectivity plots of: (a) RCA cleaned (100) p-Si wafer, (b) PS coated, (c) RTWCG SiOX passivated PS using A4:Pd solution. As can be seen, the reflection of SiOX coated PS in curve (c) in the portion of the spectra of interest for solar cells is about 10%, while from 580 nm to 1040 nm the reflectivity of SiOX coated PS in curve (d) is below 4%, which is equal or lower than that of best double layer AR coatings.

The RTWCG process of SiOCN layers on the PS surface, a room temperature process, appears highly attractive for photonic (optoelectronic) device applications, since it will provide a much more stable surface in reducing and oxidizing agents and with respect to factors such as heat, humidity, prolonged exposure to UV light, atomic oxygen and ionizing radiation during postprocessing steps and as a result of exposing the fabricated devices to such environments. Based on our preliminary work, it appears that compared to planar silicon surfaces, good quality WCG SiOCN coatings are much easier to grow on PS coated Si surfaces. The reason for this is not fully understood at the present time.

While the invention has been particularly shown and described with reference to preferred embodiments thereof, it will be understood by those skilled in the art that other changes in form and details may be made therein without departing from the spirit and scope of the invention. For instance Fe-EDTA used in combination with KFeCN increased noticeably the growth rate of SiOX oxides grown in BS-Ti34, but the Fe contamination is slightly larger. From among a large number of possible electronic and photonic (optoelectronic) device applications we have only mentioned the six above examples. It will be understood by those skilled in the art, that any of these RTWCG SiOX oxides can be grown on other than Si semiconductor substrates, including Ge, III-V and I-III-VI compound semiconductors, and used for a wide range of electronic and photonic (optoelectronic) device applications without departing from the spirit and scope of the invention. Other applications described herein, which make use of various descriptions of these oxides, are also covered by this invention. One such example is given below.

EXAMPLE 7

Novel Optical Technique for Si Surface Defect Revealing

We have mentioned that using the A4:Pd solution, the growth rate of SiOX oxides on (100) Si is much lower than that on (111) Si substrates. Because of this, on (100) Si substrates, the oxide grows preferentially at the defect areas, which reveal the (111) planes. This art-effect can be used for a non-destructive and very precise way to reveal the surface defects type and density on (100) Si surfaces. In other words, on (100) Si surface the oxide spots, which grow preferentially at the dislocation areas, can be used as an essentially nondestructive and very accurate technique for revealing the type and density of surface defects (e.g. etch pits, dislocations, and scratches). Using this approach, we consistently recorded from 5 to 10% more surface defects as when using conventional preferential etching techniques. We found that when using the preferential etching techniques the larger the defect density the larger the error in defect density. This is so, since the larger pits, overlap the smaller ones, making it difficult to accurately count their density. Using the new higher resolution technique of preferential oxidation, the defect areas are much better delineated and are much easier to visualize using any high magnification optical or electronic microscope. Using this technique, rapid and accurate automatic surface defects mapping is possible using either reflectivity, room temperature photoluminescence intensity or index of refraction imaging techniques. Because by using the solution A4:Pd the thickness of the underlying (100) Si substrate removed during the RTWCG process is less than 25% of the oxide thickness, and since less than 40 nm thick oxide is needed to easy visualize the oxide spots by any of the above optical techniques, the thickness of the removed material at the dislocation sites is less than 10 nm. This makes this novel technique essentially nondestructive, which should recommend it for large volume process control in Si wafer and device industries.

Figure 7:
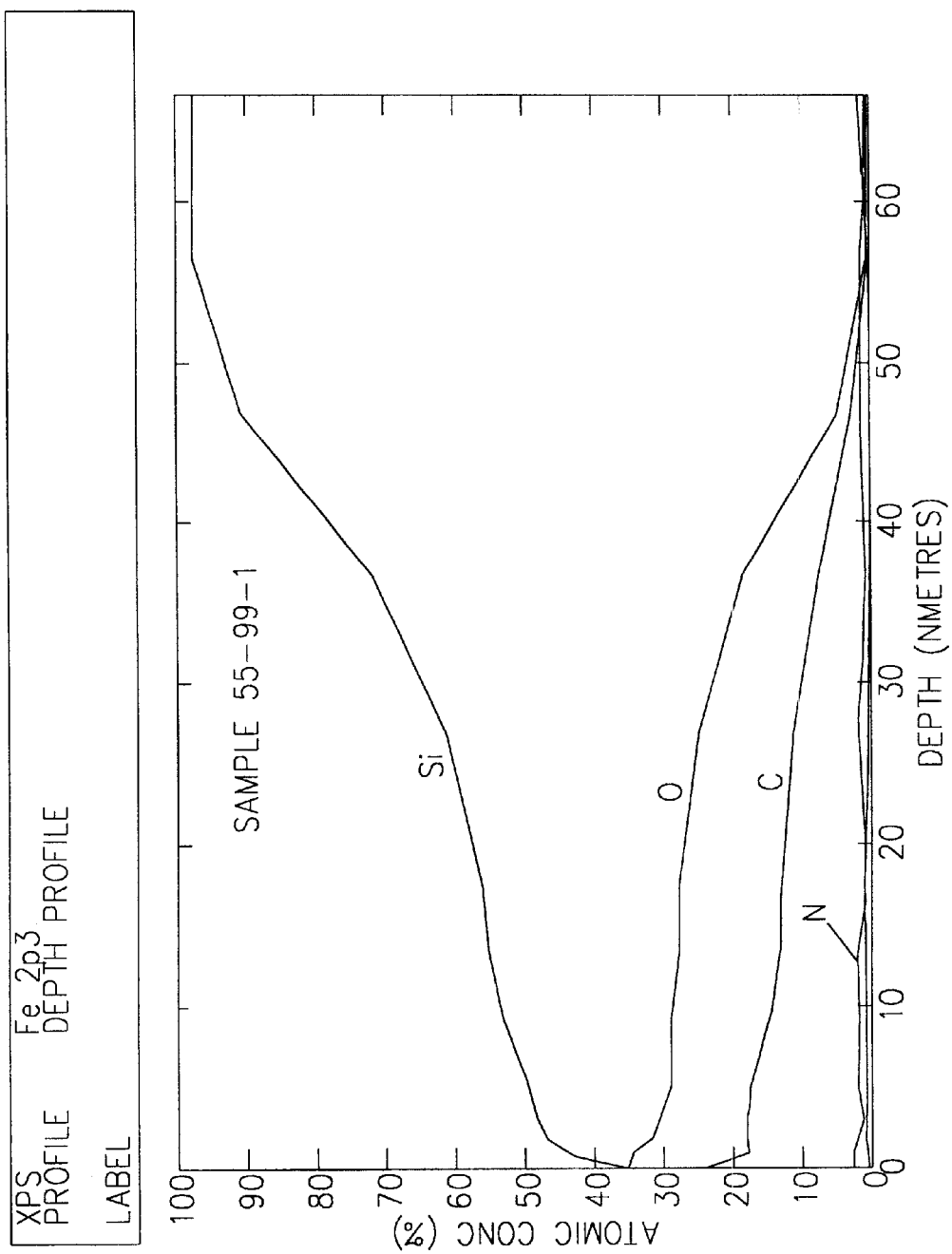
FIG. 7. is an XPS depth profile of an RTWCG SiOX thin film, grown for 10 minutes on (100) p-type Si:B substrate using a growth solution made of: 5 volume parts of 34% HSiF saturated with silica, 2 volume parts of 60% HTiF solution, 1 volume part of 3% n-BPCl, and 2 volume parts of 10% KFeCN aqueous solution.

FIG. 7 shows an XPS depth profile of a RTWCG SiOX thin film grown on (100) p-Si substrate using a growth solution made of: 5 volume parts of 34% HSiF saturated with silica, 2 volume parts of 60% HTiF solution, 1 volume part of 3% n-BPCl, and 2 volume parts of 10% KFeCN aqueous solution. The growth time of the SiOX film was 10 minutes. As indicated, the Fe surface concentration of the SiOX film is about 1%. The growth rate of the film, derived from the XPS depth profile and referenced to a standard $Ta_2O_5$ oxide, is about 5.5 nm/minute. However, Dektak profiles of etched features have shown that the real thickness of the SiOX film in FIG. 7 were about 2.2 times higher than those corresponding in the abscise of the XPS profiles. Hence, the true growth rate of the SiOX film in FIG. 7 is of about 12 nm/min.

Figure 8:
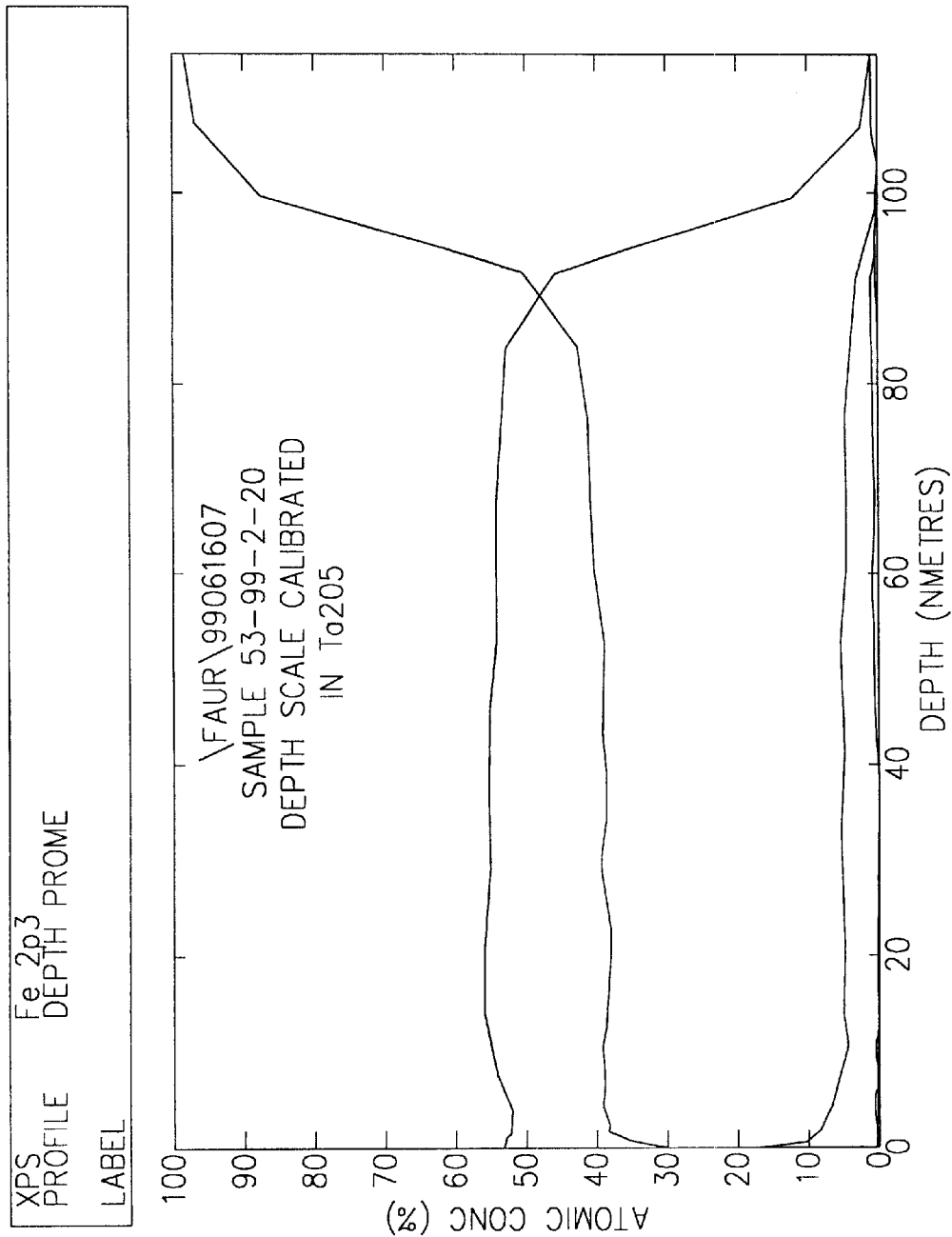
FIG. 8 is an XPS depth profile of an RTWCG SiOX thin film, grown for 20 minutes on (100) p-type Si:B substrate using a growth solution made of: 3 volume parts of 34% HSiF saturated with silica, 2 volume parts of 60% HTiF solution, 1 volume part of 5% n-BPCl, and 2 volume parts of 5% KFeCN aqueous solution.

Further reduction of the metallic impurity concentration in the SiOX film was found to be possible using various ratios of the four components of the growth solution in FIG. 7, namely HSiF saturated with silica, HTiF solution, KFeCN aqueous solution, and n-BPCl. FIG. 8 is an XPS depth profile of a RTWCG SiOX thin film grown on (100) p-Si substrate using a growth solution made of: 3 volume parts of 34% HSiF saturated with silica, 2 volume parts of 60% HTiF solution, 1 volume part of 5% n-BPCl, and 2 volume parts of 5% KFeCN aqueous solution. The growth time of the SiOX film was 20 minutes. Prior to the growth, the surface of the Si substrate was cleaned using the improved MoRCA cleaning method.

Figure 9:
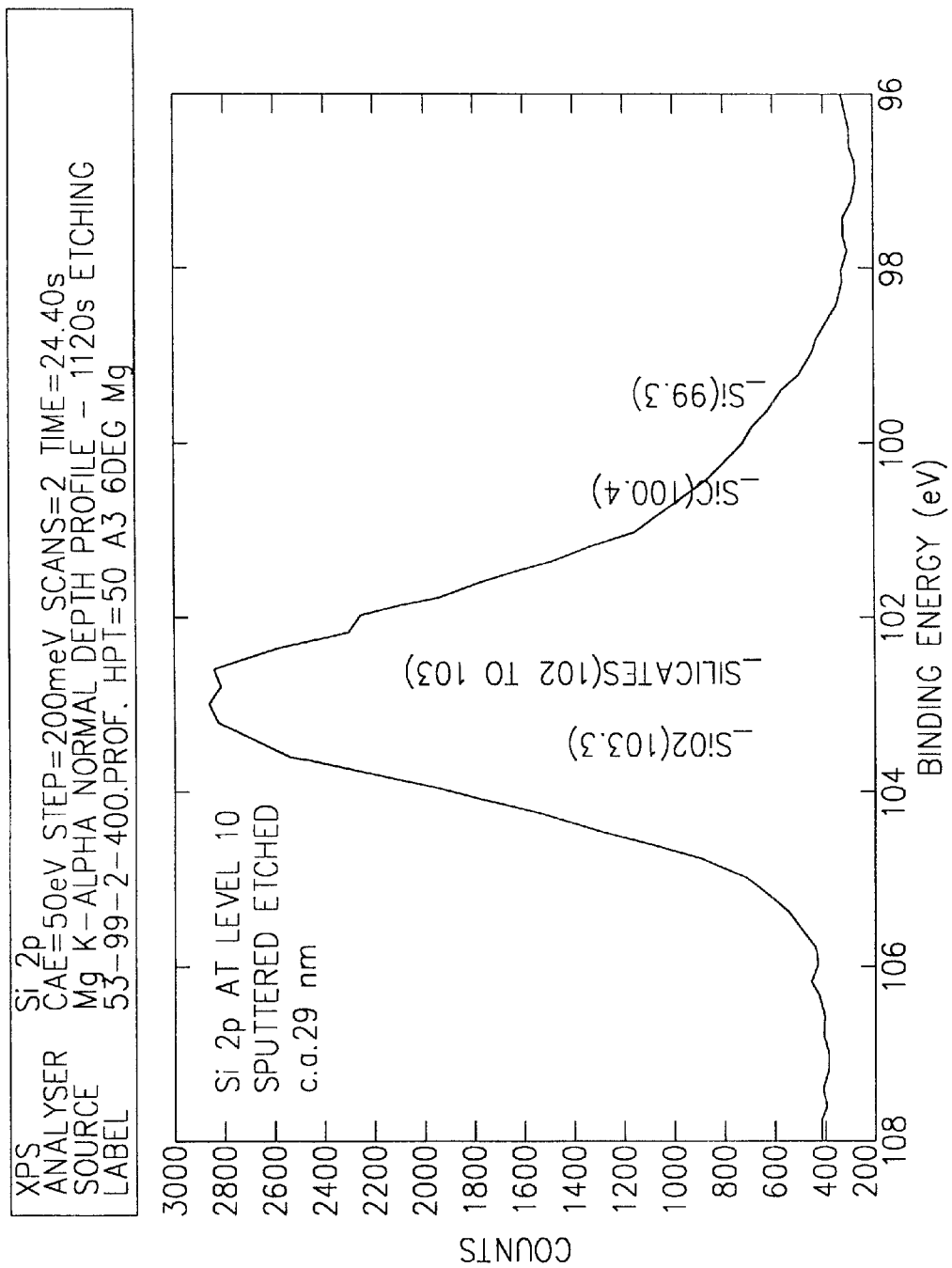
FIG. 9 is an XPS Si 2p peak after sputtering 0.29 nm from the surface of the SiOX thin film in FIG. 8.

In Table 6 are shown quantitative XPS data, including the position, peak areas and the atomic concentration of the main components of the SiOX film oxide in FIG. 9, recorded after sputtering about 29 nm from the surface.

TABLE 6

Quantification Table for Experiment SiOX thin film in FIG. 9, after sputtering 29 nm from the surface.

| Peak | Binding Energy (eV) | SF | Pk. Area | Tx. Function | [AT]% |
|---|---|---|---|---|---|
| Fe 2p3 | 706.40 | 2.00 | 136.593 | 0.3 | 0.056 |
| F 1s | 687.4 | 1.00 | 425.020 | 0.3 | 0.343 |
| O 1s | 532.20 | 0.66 | 50126.168 | 0.3 | 54.314 |
| Ti 2p | 460.60 | 1.80 | 161.714 | 0.3 | 0.061 |
| N 1s | 398.00 | 0.42 | 422.887 | 0.3 | 0.490 |
| C 1s | 284.00 | 0.25 | 2552.198 | 0.2 | 6.297 |
| Si 2p | 102.80 | 0.27 | 18329.264 | 0.2 | 38.438 |

The chemical composition of the SiOX films as a function of depth was derived for each representative sample from an analysis of the Si 2p, O 1s, and C 1s peaks binding energies (BE's).

By using the pre-growth MoRCA clean sequence described above, the percent thickness deviation of a SiOX film grown on a 5-inch test grade Si wafer was 0.45%. The percent thickness deviation recorded among five similarly coated 5-inch Si wafers was from 0.75% to 3.33%. The average deviation for each SiOX coating was determined from among five measurements performed in the center, and about 1-inch each from the top, bottom, left and right side respectively of the 5-inch wafers. The film thickness determination of MoRCA pre-growth process step, was done using Dektak profiles etched into the SiOX film. The SiOX thickness for the five 5-inch wafers was derived from ellipsometric measurements. The SiOX films were grown on the above 5-inch Si wafers by keeping the Si substrates stationary inside a growth solution as in FIG. 9. This resulted in all but one sample having the SiOX film thinner in the center. This accounts for the relatively large percent average deviation, especially when standard RCA cleaning was used. Recent results show that if the solution moves relative to the substrate, the SiOX thickness difference between the center and edge of the wafer is minimal even when standard RCA clean is used.

While the invention has been particularly shown and described with reference to preferred embodiments thereof, it will be understood by those skilled in the art that other changes in form and details may be made therein without departing from the spirit and scope of the invention. From among a large number of potential electronic and photonic (optoelectronic) device applications it will be understood by those skilled in the art that any of these RTWCG SiO-based thin film dielectrics can be grown on other than Si semiconductor substrates, including Ge, III-V and I-III-VI compound semiconductors, and used for a wide range of electronic and photonic (optoelectronic) device applications without departing from the spirit and scope of the invention.

It is an object of a further embodiment of the invention to provide a process for room temperature wet growth of silicon oxide coatings for use in various fields of application, including micro-electronics, discrete electronics, thin film transistors, opto-electronics, solar cells and other applications. Examples of microelectronic applications include protective coatings, first oxide layer, bottom anti-reflection coating for deep submicron photolithography, field and gate oxide, diffusion barrier layer, sidewall spacers/shallow trench insulation, copper wire passivation, intralevel dielectrics and non linear optical coatings. Examples of discrete electronic applications include device insulation. Examples of thin film transistor applications for flat panel display include gate oxide, field oxide and sidewall spacers. Optoelectronics applications include porous silicon passivation, and coatings for sensors, detectors, semiconductors and lasers. Examples of solar cell applications include anti-reflection coatings for SI solar cells, anti-reflection coatings for GaAs, CIS, CdTe solar cells, and transparent conductive coatings for thin film solar cells. Other applications include GaAs technology, metal coatings for special environments and extensions of the coatings to include varied substrate and coating chemistries.

The reaction coordination complex may further include a catalyst from Group VIII of the periodic table, i.e., platinum, palladium, ruthenium and rhodium. Furthermore, titanium can be used as the catalyst. Specific examples include palladium II trifluoroacetate and hydrofluorotitanate. Also, the pH of the solution can be adjusted to influence the growth characteristics of the oxide layer, i.e. the rate of growth, and potentially, the composition of the growth layer.

Substrates may be any material on which it is desirable to have a silicon oxide coating including:

1. silicon wafers of all crystalline configurations and architectures such as porous, grooved, patterned, trenched, and scribed;
2. plastic, glass, or metal objects or films;
3. GaAs layers;
4. or any semiconductor layer, substrate or device using Group IV elements, and III-V, I-III-VI, or II-VI compound semiconductors such as substrates and active layers used in integrated circuitry, photonics and optoelectronic devices.

The present invention has a particular advantage for use in the production of integrated electronic components. As the number of desired components are increased and correspondingly, the scale of the size of the components are decreased, the production processes are ever more taxed. In particular, high temperatures lead to disruption of the components and result in processing failures. Thus, the present room temperature invention can be advantageously used for forming insulation coatings at various levels of electronic micro-component production. The present invention can apply to the field and gate production and the sidewall and shallow trench isolation fill. These applications require that the coating is relatively uniform in thickness and in adhesion to the substrate, without obscuring the topography, such as melting the sidewalls, or forming bird beaks or gaps which could lead to short circuiting within the finished product. U.S. Pat. No. 4,462,846 refers to prior art methods of dealing with such applications and is incorporated herein by reference.

The foregoing and other objects, features, and advantages of the invention are now apparent from the preceding more particular examples of preferred embodiments of the invention.

While in accordance with the Patent Statutes the best mode and preferred embodiment have been set forth, the scope of the invention is not limited thereto but rather by the scope of the attached claims.

What is claimed is:

1. A method for growth of a silicon oxide layer on a substrate to produce a silicon oxide layer comprising:
   a) providing a substrate;
   b) providing a reaction mixture comprising a silicon source, a pyridine compound, a catalyst and an aqueous reduction oxidation solution; and
   c) reacting the mixture with the substrate to form said silicon oxide layer.

2. A method as set forth in claim 1, wherein the silicon source comprises an organic compound which is a source of silicon.

3. A method as set forth in claim 1, wherein the silicon source comprises an inorganic compound which is a source of silicon.

4. A method as set forth in claim 1, wherein said silicon source includes one or more of more of $SiF_4$, $SiBr_4$, $SiCl_2O$, $K_2SiF_6$, $Mg_2Si3O_8$, $MoSi_2$, $Na_2SiO_3$, $SiS_2$, $ZrSi_2$, $Mg_2Si$, $H_2SiF_6$, $NH_4SiF_6$, $SiO_2$, $SiO$, $Si$, $(CH_3)_3SiOK$, $Si(OOCCH3)4$, $(CH_3)_4NOH:10SiO_2$, $(CH_3)_3CSi(CH_3)_2Cl$, $[(CH_3)SiO]_4$, and $[(CH_3)Si]NK$.

5. A method as set forth in claim 1, wherein said reduction oxidation solution comprises a solution with a pentavalent, tetravalent, trivalent or a bivalent metal.

6. A method as set forth in claim 5, wherein said bivalent or trivalent metal is one or more of iron, zinc, manganese, and chromium.

7. A method as set forth in claim 6, wherein said reduction oxidation solution is a $Fe^{2+}/Fe3+$ solution.

8. A method as set forth in claim 1, wherein said pyridine compound is one or more of pyridine and C1–C6 alkyl pyridine and salts and complexes thereof.

9. A method as set forth in claim 8, wherein said butyl pyridinium salt is one of the n,n-butylpyridinium chloride ($C_9H_{14}ClN$), pyridine ($C_5H_5N$), Pyridine N-oxide ($C_5H_5NO$), or Hydrogen fluoride-pyridine $C_5H_5N$ $(HF)_x$.

10. A method as set forth in claim 1 where the catalyst is $H_2TiF_6$.

11. A method as set forth in claim 1, wherein said reaction takes place at a temperature of below about 35 degrees C.

12. A method as set forth in claim 1, wherein the silicon oxide layer is grown at a rate of at least about 0.2 nm/minute.

13. A method as set forth in claim 1, wherein said silicon oxide layer is a component in a solar cell.

14. A method as set forth in claim 1, wherein said silicon oxide layer is a gate oxide for low temperature thin film transistors.

15. A method as set forth in claim 1, wherein said silicon oxide layer is a component in a flat panel display.

16. A method as set forth in claim 1, wherein said silicon oxide layer is a component for microelectronics.

17. A method as set forth in claim 1, wherein said silicon oxide layer is grown on a substrate as a protective coating.

18. A method as set forth in claim 1, wherein said silicon oxide layer is grown on a substrate for deep UV photolithography.

19. A method as set forth in claim 1, wherein said silicon oxide layer is a component for integrated circuits.

20. A method as set forth in claim 1, wherein said silicon oxide layer is a semiconductor.

21. A method as set forth in claim 1, wherein said silicon oxide layer is a transparent conductive film in thin film solar cells and other photonic devices.

22. A method for growth of a silicon oxide layer on a substrate to produce a silicon oxide layer comprising:
   (a) providing a substrate,
   (b) providing a reaction mixture comprising a silicon source, a salt of butyl pyridinium, and an aqueous iron reduction oxidation solution;
   (c) reacting the mixture with the substrate to form said silicon oxide layer, in the presence of a catalyst.

23. A method as set forth in claim 22, wherein said silicon source is one or more of $SiF_4$, $SiBr_4$, $SiCl_2O$, $K_2SiF_6$, $Mg_2Si3O_8$, $MoSi_2$, $Na_2SiO_3$, $SiS_2$, $ZrSi_2$, $Mg_2Si$, $H_2SiF_6$, $NH_4SiF_6$, $SiO_2$, $SiO$, $Si$, $(CH_3)_3SiOK$, $(CH_3)_4NOH:10SiO_2$, $(CH_3)_3CSi(CH_3)_2Cl$, $[(CH_3)SiO]_4$, $[(CH_3)Si]NK$ and $Si(OOCCH_3)4$.

24. A method as set forth in claim 22, wherein said butyl pyrindinium salt is n,n-butyl.

25. A method as set forth in claim 22, wherein said reaction takes place at a temperature of below about 35 degrees C.

26. A method as set forth in claim 22, wherein the silicon oxide layer is grown at a rate of at least about 0.2 nm/minute.

27. A method as set forth in claim 22, wherein said silicon oxide layer is a component in a solar cell.

28. A method as set forth in claim 22, wherein said silicon oxide layer is a gate oxide for low temperature thin film transistors.

29. A method as set forth in claim 22, wherein said silicon oxide layer is a component in a flat panel display.

30. A method as set forth in claim 22, wherein said silicon oxide layer is component for microelectronics.

31. A method as set forth in claim 22, wherein said silicon oxide layer is grown on a substrate as a protective coating.

32. A method as set forth in claim 22, wherein said silicon oxide layer is grown on a substrate for deep UV photolithography.

33. A method as set forth in claim 22, wherein said silicon oxide layer is component for integrated circuits.

34. A method as set forth in claim 22, wherein said silicon oxide layer is an semiconductor.

35. A method for growth of a silicon oxide layer on a substrate to produce an silicon oxide layer comprising:
   (a) providing a substrate which is cleaned using a cleaning sequence;
   (b) providing a reaction mixture comprising a silicon source, a salt of butyl pyridinium, a catalyst and an aqueous iron reduction oxidation solution; and
   (c) reacting the mixture with the substrate to form said silicon oxide layer.

36. A method as set forth in claim 35, wherein said silicon source is one or more of $SiF_4$, $SiBr_4$, $SiCl_2O$, $K_2SiF_6$, $Mg_2Si3O_8$, $MoSi_2$, $Na_2SiO_3$, $SiS_2$, $ZrSi_2$, $Mg_2Si$, $H_2SiF_6$, $NH_4SiF_6$, $SiO_2$, $SiO$, $Si$, $(CH_3)_3SiOK$, $(CH_3)_4NOH:10SiO_2$, $(CH_3)_3CSi(CH_3)_2Cl$, $[(CH_3)SiO]_4$, $[(CH_3)Si]NK$ and $Si(OOCCH_3)_4$.

37. A method as set forth in claim 35, wherein said butyl pyrindinium salt is n,n-butyl.

38. A method as set in claim 35 where the catalyst is $H_2TiF_6$.

39. A method as set forth in claim 35, wherein said reaction takes place at a temperature of below about 35 degrees C.

40. A method as set forth in claim 35, wherein the silicon oxide layer is grown at a rate of at least about 0.2 nm/minute.

41. A method as set forth in claim 35, wherein said silicon oxide layer is a component in a solar cell.

42. A method as set forth in claim 35, wherein said silicon oxide layer is a gate oxide for low temperature thin film transistors.

43. A method as set forth in claim 35, wherein said silicon oxide layer is a component in a flat panel display.

44. A method as set forth in claim 35, wherein said silicon oxide layer is component for microelectronics.

45. A method as set forth in claim 35, wherein said silicon oxide layer is grown on a substrate as a protective coating.

46. A method as set forth in claim 35, wherein said silicon oxide layer is grown on a substrate for deep UV photolithography.

47. A method as set forth in claim 35, wherein said silicon oxide layer is component for integrated circuits.

48. A method as set forth in claim 35, wherein said silicon oxide layer is an semiconductor.

49. A method as set forth in claim 35, wherein said cleaning sequence includes a modified RCA cleaning sequence including the following:
   a) MoPiranha clean with $\{[98\%\ H_2SO_4:30\%\ H_2O_2: H_2O]\ (2:1:20)\}$, $H_2O$ rinse, aqueous HF solution rinse with 0.1 to 1.0% HF;
   b) MoRCA, SC-1 clean with $\{[NH4OH:H2O2: H_2O]\ (3:1:25)\}$, $H_2O$ rinse, aqueous HF solution rinse with 0.1 to 1.0% HF;
   c) MoRCA, SC-2, clean with $\{[0.05\ mole/liter\ HCl: H_2O_2](25:1)\}$, $H_2O$ rinse, aqueous HF solution rinse with 0.1 to 1.0% HF.

50. A method as set forth in claim 49, wherein said aqueous HF solution is 0.5% HF.

51. A method as set forth in claim 35, wherein said silicon oxide layer is grown on a substrate for deep UV photolithography.

52. A method as set forth in claim 35, wherein said silicon oxide layer is a component for an integrated circuit.

53. A method as set forth in claim 35, wherein said silicon oxide layer is a semiconductor.

54. A method as set forth in claim 35, wherein said cleaning sequence includes the steps of a rinse with a solution of $H_2SO_4$, $H_2O_2$ and $H_2O$, followed by a $H_2O$ and a HF rinse; a rinse of $NH4OH$, $H_2O_2$ and $H_2O$, followed by a $H_2O$ and a HF rinse; and a rinse of HCl, $H_2O_2$ and $H_2O$, followed by a $H_2O$ and a HF rinse.

55. A method as set forth in claim 54, wherein the $H_2SO_4$, $H_2O_2$ and $H_2O$ is at a ratio of about 1–10:1:40–100 parts by weight.

56. A method as set forth in claim 54, wherein the HF is in an aqueous solution with from about 0.1 to about 1% by weight of HF.

* * * * *